(12) United States Patent
Miida

(10) Patent No.: US 6,656,777 B2
(45) Date of Patent: Dec. 2, 2003

(54) SOLID STATE IMAGING DEVICE, METHOD OF MANUFACTURING THE SAME, AND SOLID STATE IMAGING SYSTEM

(75) Inventor: Takashi Miida, Kanagawa (JP)

(73) Assignee: Innotech Corporation (JP)

( * ) Notice: Subject to any disclaimer, the term of this patent is extended or adjusted under 35 U.S.C. 154(b) by 0 days.

(21) Appl. No.: 10/176,174

(22) Filed: Jun. 21, 2002

(65) Prior Publication Data

US 2002/0167030 A1 Nov. 14, 2002

Related U.S. Application Data

(62) Division of application No. 09/715,065, filed on Nov. 20, 2000, now Pat. No. 6,504,194.

(30) Foreign Application Priority Data

| Dec. 1, 1999 | (JP) | ............................................. 11-342587 |
| Dec. 1, 1999 | (JP) | ............................................. 11-342588 |
| Oct. 26, 2000 | (JP) | ...................................... 2000-327663 |

(51) Int. Cl.$^7$ ............................................. H01L 21/84
(52) U.S. Cl. ........................ 438/154; 257/291; 257/292; 257/293
(58) Field of Search ........................ 438/48, 519, 526, 438/527, 199; 257/291, 292

(56) References Cited

U.S. PATENT DOCUMENTS

| 4,148,048 A | 4/1979 | Takemoto et al. ........... 257/292 |
| 4,268,845 A | 5/1981 | Koike et al. ................. 257/292 |
| 4,316,205 A | 2/1982 | Aoki et al. .................. 257/292 |
| 4,630,091 A | 12/1986 | Kuroda et al. ............... 257/292 |
| 4,733,286 A | 3/1988 | Matsumoto .................... 257/291 |
| 4,878,120 A | 10/1989 | Matsumoto et al. ......... 257/291 |
| 4,901,129 A | 2/1990 | Hynecek ....................... 357/30 |
| 5,872,371 A | 2/1999 | Guidash et al. ............. 257/292 |
| 6,051,857 A | 4/2000 | Miida ........................... 257/292 |
| 2002/0140036 A1 * | 10/2002 | Ma et al. ..................... 257/351 |
| 2003/0075758 A1 * | 4/2003 | Sundaresan et al. .......... 257/69 |

FOREIGN PATENT DOCUMENTS

| JP | 2-304973 | 12/1990 |
| JP | 6-120473 | 4/1994 |

* cited by examiner

Primary Examiner—Wael Fahmy
Assistant Examiner—Nathan W. Ha
(74) Attorney, Agent, or Firm—Lorusso, Loud & Kelly

(57) ABSTRACT

A first buried layer of one conductivity and a first well region of opposite conductivity are formed in a semiconductor layer using a first mask. A second mask is used to form a second buried layer and a second well region of the opposite conductivity and to introduce impurity of the one conductivity type into a surface of the second well to form a channel doped layer of the one conductivity. A high concentration buried layer of the opposite conductivity is formed by introducing opposite conductivity impurity into the second well region using a third mask. A gate insulating film is formed on the semiconductor layer by thermal oxidation. A source region and a drain region of the one conductivity type are formed on the surface of the second well region, on both sides of a gate electrode.

10 Claims, 23 Drawing Sheets

Channel Width Direction

Channel Length Direction

SOLID STATE IMAGING DEVICE, METHOD OF MANUFACTURING THE SAME, AND SOLID STATE IMAGING SYSTEM

CROSS-REFERENCE TO RELATED APPLICATIONS

This application is a division of U.S. Ser. No. 09/715,065 filed Nov. 20, 2000, issued as U.S. Pat. No. 6,504,194 Jan. 7, 2003 and claims priority of Japanese Application No. 11-342587 filed Dec. 1, 1999, Japanese Application No. 11-342588 filed Dec. 1, 1999 and of Japanese Application No. 2000-327663 filed Oct. 26, 2000.

BACKGROUND OF THE INVENTION

1. Field of the Invention

The present invention relates to a solid state imaging device, a method of manufacturing the same, and a solid state imaging system and, more particularly, a solid state imaging device using a MOS image sensor of a threshold voltage modulation system employed in a video camera, an electronic camera, an image input camera, a scanner, a facsimile, or the like, a method of manufacturing the same, and a solid state imaging system.

2. Description of the Prior Art

Since a semiconductor image sensor such as a CCD image sensor, a MOS image sensor, etc. is excellent in mass productivity, such semiconductor image sensor is applied to most of the image input devices with the progress of the fine pattern technology.

In particular, the MOS image sensor is reconsidered in recent years because of its merits that the power consumption is small rather than the CCD image sensor and that the sensor element and peripheral circuit elements can be fabricated by the same CMOS technology.

In view of the trend in the times, the applicant of this application has improved the MOS image sensor, and then secured the Patent (Registration Number 2935492) by filing the Patent Application (Patent Application Hei 10-186453) in connection with the image sensor device which has the carrier pocket (high concentration buried layer) under the channel region.

In the invention of this Patent (Registration Number 2935492), in order to suppress the injection of the light emitting charges into the surface defects of the semiconductor layer and thus reduce the noise, the photo diode has the buried structure for the light emitting charges (in this case, holes). More particularly, the n-type impurity region is formed on the surface layer of the p-type well region. This p-type well region is formed integrally with the p-type base region of the light signal detecting MOS transistor, and this n-type impurity region is formed integrally with the n-type drain region. As a result, the configuration can be formed in which the light emitting charges generated in the p-type well region of the photo diode portion can contribute to the detection of the light signal.

Meanwhile, in the MOS image sensor, normally the spectral sensitivity characteristic, especially the red-color sensitivity is low. Therefore, in order to broaden much more the applications of the MOS image sensor in the future, it is desired to achieve the improvement of the red-color sensitivity. In addition, it is desired to achieve the improvement of the blue-color sensitivity. At the same time, the higher integration degree of the solid state imaging device is also desired.

SUMMARY OF THE INVENTION

It is an object of the present invention to provide a solid state imaging device using a MOS image sensor capable of achieving improvement in red-color sensitivity and improvement in blue-color sensitivity while maintaining the performance of a light signal detecting MOS transistor, a method of manufacturing the same, and a solid state imaging system.

With reference to FIG. 2A in order to improve the red-color sensitivity, it is desired that the n-type epitaxial layer (n-type layer) 12 on the p-type substrate 11 should be formed thicker than in the structure of applicants' Patent Registration Number 2935492. However, if the n-type epitaxial layer (n-type layer) 12 is formed thicker, the reset voltage for the initialization to discharge the carriers must be increased and thus the performance of the light signal detecting MOS transistor is lowered. In other words, in order to improve the red-color sensitivity and to maintain/improve the reset efficiency, structures are needed which are incompatible with each other.

In the present invention, as exemplified by the embodiment shown in FIGS. 1 and 2A. in the store period during when the carriers are generated by the light in the photo diode 111 having the above structure and then stored in the high concentration buried layer (carrier pocket) 25 of opposite conductivity type, the depletion layer can spread from a boundary surface between the one conductivity type impurity region 17 and the opposite conductivity type first well region 15a in the photo diode 111 to the overall first well region 15a by the applied voltage. Further, the depletion layer can spread from a boundary surface between the opposite conductivity type substrate 11 and the one conductivity type buried layer 32 in the photo diode 111 to the first semiconductor layers 12 and 32. Therefore, the light emitting charges generated in the depleted first well region 15a and the first semiconductor layers 12 and 32 can contribute to the detection of the light signal.

In other words, since the thicknesses of the first semiconductor layers 12 and 32 are increased, the thickness of the light receiving region can be extended effectively with respect to the long wavelength light such as the red-color. Accordingly, the improvement of the red-color sensitivity can be achieved.

In contrast, in the sweep period (initialization period) during when the carriers are swept out from the high concentration buried layer 25 and the second well region 15b in the light signal detecting MOS transistor 112 portion, the depletion layer can spread from a boundary surface between the one conductivity type channel doped layer 15c and the opposite conductivity type second well region 15b into the second well region 15b by the applied voltage, and also the depletion layer can spread from a boundary surface between the opposite conductivity type sixth semiconductor layer 33 and the one conductivity type third semiconductor layer 12 into the third semiconductor layer 12 under the second well region 15b.

As a result, the electric field from the gate electrode 19 can extend mainly to the depleted second well region 15b and the third semiconductor layer 12 formed under the second well region 15b.

In the case of the present invention, the thickness of the third semiconductor layer 12 under the second well region 15b is small and the opposite conductivity type high concentration sixth semiconductor layer 33 is formed in the neighborhood of the one conductivity type third semiconductor layer 12 on the substrate 11 side. Therefore, extension of the depletion layer from the boundary surface between the opposite conductivity type sixth semiconductor layer 33 and the one conductivity type third semiconductor layer 12 into the sixth semiconductor layer 33 in the sweep period can be limited, and also the width of the depletion layer extending from the boundary surface to the third semiconductor layer 12 can be reduced. That is, the voltage from the gate electrode 19 is mainly applied to the second well region 15b.

Accordingly, since the abrupt potential change that is fitted to sweep out the carriers is caused in the second well region 15b and thus the strong electric field is applied. Therefore, the stored carriers can be swept out effectively from the high concentration buried layer (carrier pocket) 25 and the second well region 15b by the low reset voltage, whereby the reset efficiency can be improved.

In addition, according to the present invention, since the low concentration drain (LDD) structure is employed as the structure of the light signal detecting MOS transistor 112, the short channel of the light signal detecting MOS transistor 112 can be achieved and thus the higher integration degree of the solid state imaging device can be achieved.

Also, the impurity region 117 is formed at the same time when the low concentration drain region 117a is formed. That is, since the impurity concentration of the impurity region 117 is set to the low concentration, the impurity region 117 can be formed at the shallow position from the surface. Accordingly, the blue-color that has the short wavelength and attenuates suddenly in the vicinity of the surface can be received at the sufficient intensity.

In addition, since the one conductivity type impurity region 17 is formed on the surface layer of the opposite conductivity type first well region 15a serving as the light receiving region, the photo diode 111 has the buried structure for the light emitting charges.

Accordingly, since the neutralized state against the trap level of the surface and the hole generation center can be maintained, the noise and the dark current due to the charges except the light emitting charge can be maintained low.

Accordingly, improvement of the blue-color sensitivity can be achieved while maintaining the noise and the dark current.

Also, the CMOS circuit for driving the solid state imaging device is formed on the same substrate as the solid state imaging device, and the low concentration impurity region 17 is formed at the same time when the low concentration drain region of the MOS transistor constituting the CMOS circuit and having the LDD structure is formed, and in addition the high concentration contact layer is formed at the same time when the high concentration drain region of the MOS transistor having the LDD structure is formed.

Accordingly, improvement of the blue sensitivity can be achieved while maintaining the noise and the dark current without increasing new manufacturing steps.

Correspondences between technical terms in the solid state imaging device manufacturing method and technical terms in the solid state imaging device are given as follows. That is, a part of the seventh semiconductor layers 11 and 31 corresponds to the first base layer, and a part of the seventh semiconductor layers 11 and 31 and the second buried layer 33 correspond to the second base layer (i.e., the substrate 11 and the sixth semiconductor layer). The first buried layer 32 corresponds to the buried layer or the fifth semiconductor layer, and the second buried layer 33 corresponds to the sixth semiconductor layer. The one conductivity type region 12 corresponds to the one conductivity type well region, and the first buried layer 32 and the one conductivity type region 12 correspond to the first semiconductor layer (i.e., the fifth semiconductor layer and the one conductivity type well region). The first well region 15a corresponds to the second semiconductor layer, and the one conductivity type region 12 corresponds to the one conductivity type third semiconductor layer (i.e., one conductivity type well region). The second well region corresponds to the fourth semiconductor layer.

DESCRIPTION OF THE PREFERRED EMBODIMENTS

Embodiments of the present invention will be explained in detail with reference to the accompanying drawings hereinafter.

First Embodiment

Figure 1:
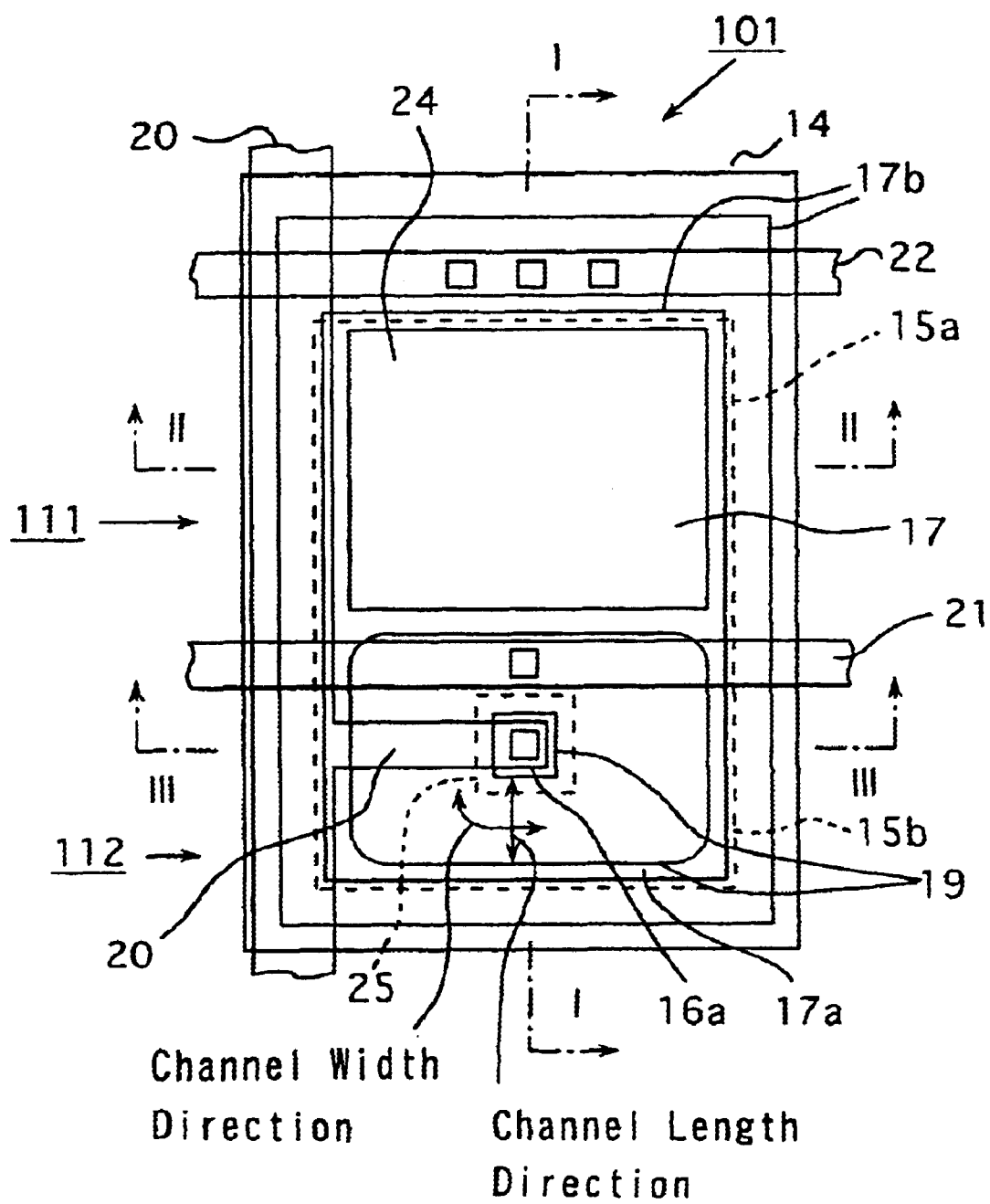
FIG. 1 is a plan view showing a device layout of a unit pixel of a solid state imaging device according to a first embodiment of the present invention.

FIG. 1 is a plan view showing a device layout of a unit pixel of a solid state imaging device according to a first embodiment of the present invention.

As shown in FIG. 1, a photo diode 111 and a light signal detecting MOS transistor 112 are formed adjacently in a unit pixel 101. They have different well regions, i.e., a first well region (second semiconductor layer) 15a and a second well region (fourth semiconductor layer) 15b, which are coupled in contact mutually, respectively. The first well region 15a of the photo diode 111 portion serves as a part of the charge generating region which can generate the charges by the light irradiation. The second well region 15b of the light signal detecting MOS transistor 112 portion serves as a gate region which can change a threshold voltage of the channel by the potential applied to this region 15b.

An impurity region 17 of the photo diode 111 and a drain region 17a of the light signal detecting MOS transistor 112 are formed integrally such that most of the regions overlaps with surface layers of the first well region 15a and the second well region 15b that communicate each other. The drain region 17a is formed to surround an outer peripheral portion of a ring-like gate electrode 19. A source region 16a is formed to be surrounded by an inner periphery of the ring-like gate electrode 19. In addition, a carrier pocket (high concentration buried layer) 25, that is a feature of this MOS image sensor, is formed in the second well region 15b under the gate electrode 19 and around the source region 16a to surround the source region 16a.

The drain region 17a is connected to a drain voltage (VDD) supply line 22 via a low resistance contact layer 17b. The gate electrode 19 is connected to a vertical scanning signal (VSCAN) supply line 21. The source region 16a is connected to a vertical output line 20 via a low resistance contact layer 16b.

Also, an insulating film covers the elements described above. A region other than a light receiving window 24 of the photo diode 111 is light-shielded by a metal layer (light shielding film) 23 formed on the covering insulating film.

In the above MOS image sensor, a device operation for detecting the light signal is carried out repeatedly like sweep period (initialization period)—store period—read period—sweep period (initialization period)— . . . .

In the sweep period (initialization period), before the light emitting charges (light emitting carriers) are stored, the carrier pocket 25 is made empty by eliminating the light emitting charges which have been read. In addition, residual charges such as the holes, the electrons, etc., which are trapped at the surface state or neutralize acceptors, donors, etc., are eliminated from the semiconductor prior to the reading of the light signal. A voltage of more than about +5 V, normally about 7 to 8 V, is applied to the source region, the drain region, and the gate electrode.

In the store period, the carriers are generated by the light irradiation, then drifted in the first well region 15a and the second well region 15b, and then stored in the carrier pocket 25. A voltage of almost +2 to 3 V is applied to the drain region, and also a low voltage by which the MOS transistor 112 can be held at its cut-off state is applied to the gate electrode.

In the read period, change in the threshold voltage of the light signal detecting MOS transistor due to the light emitting charges stored in the carrier pocket is read as change in source potential. In order to make the MOS transistor 112 operate in its saturation state, a voltage of almost +2 to 3 V is applied to the drain region and a voltage of almost +2 to 3 V is applied to the gate electrode.

Next, a device structure of the MOS image sensor according to the first embodiment of the present invention will be explained with reference to a sectional view hereunder.

Figure 2A:
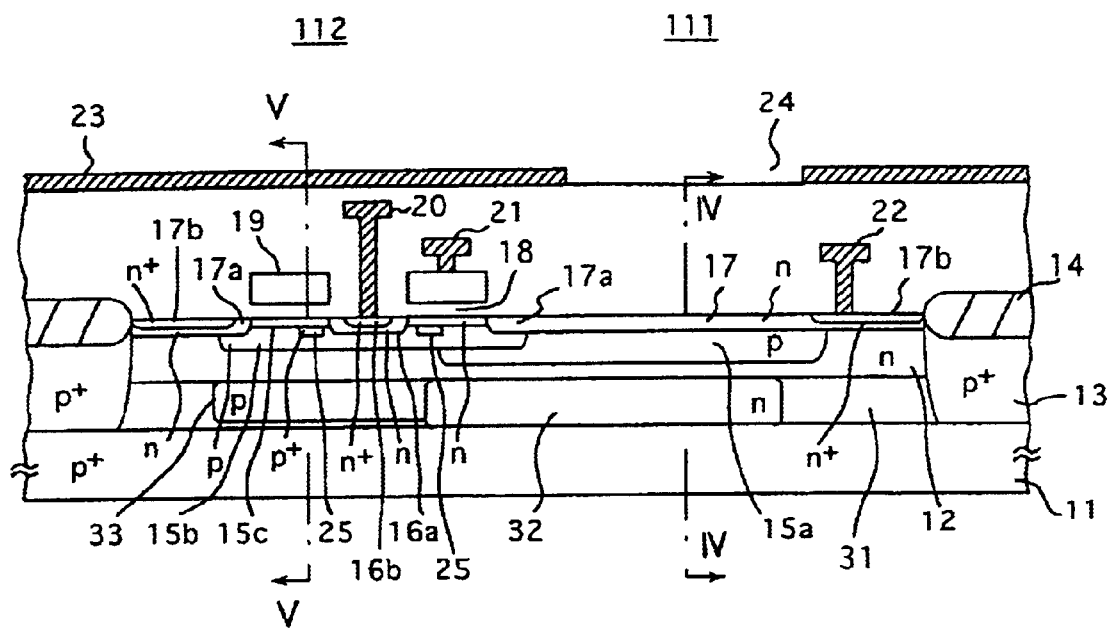
FIG. 2A is a sectional view showing a device structure of the unit pixel of the solid state imaging device according to a first embodiment of the present invention, taken along a I—I line in FIG. 1.
Figure 2B:
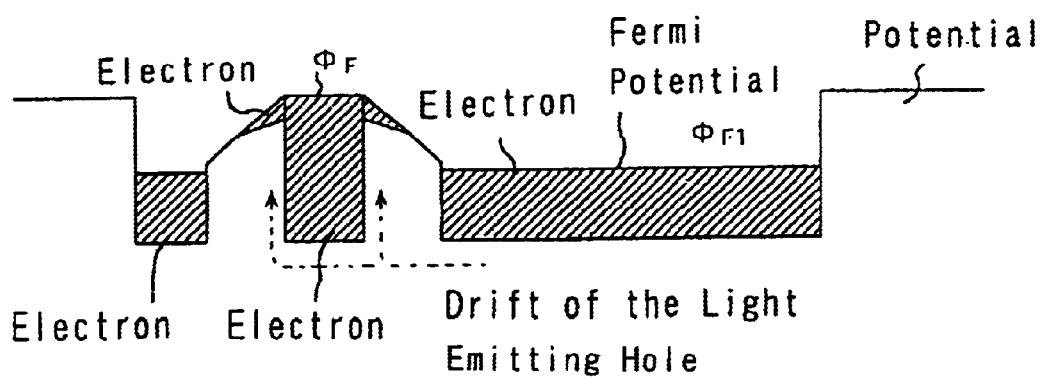
FIG. 2B is a view showing potential behaviors in the situation that light emitting holes are stored in a carrier pocket and electrons are induced in the channel region to generate an inversion region.

FIG. 2A is a sectional view showing a device structure of the solid state imaging device according to the first embodiment of the present invention, which is equivalent to a sectional view taken along a I—I line in FIG. 1. FIG. 2B is a view showing potential behaviors along a surface of the semiconductor substrate.

Figure 3:
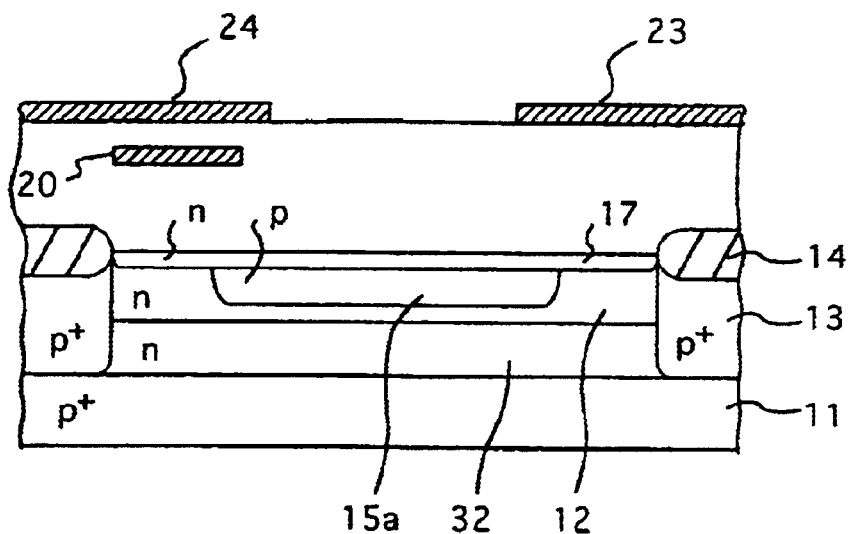
FIG. 3 is a sectional view showing a structure of a photo diode in the unit pixel of the solid state imaging device according to the first embodiment of the present invention, taken along a II—II line in FIG. 1.
Figure 4:
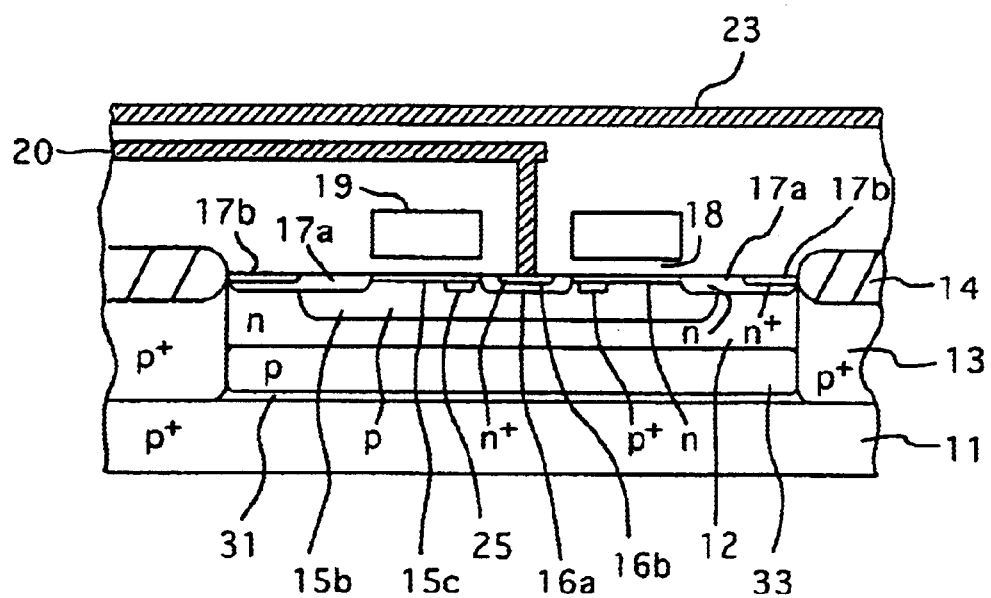
FIG. 4 is a sectional view showing a structure of a light signal detecting MOS transistor in the unit pixel of the solid state imaging device according to the first embodiment of the present invention, taken along a III—III line in FIG. 1.

FIG. 3 is a sectional view taken along a II—II line in FIG. 1. FIG. 4 is a sectional view taken along a III—III line in FIG. 1.

As shown in FIG. 2A, an epitaxial layer 31 is formed by epitaxially growing p-type silicon, whose impurity concentration is more than $1 \times 10^{15}$ cm$^{-3}$ and whose thickness is more than 3 μm, on a p-type silicon substrate 11 whose impurity concentration is more than $1 \times 10^{18}$ cm$^{-3}$. The above constructs a seventh semiconductor layer of opposite conductivity type.

A unit pixel consisting of the photo diode 111 and the light signal detecting MOS transistor 112 is formed on the epitaxial layer 31. Then, a field insulating film 14 and an element isolation layer 13 are formed between adjacent unit pixels 101 to isolate the unit pixels 101. The field insulating film 14 is formed on a surface of the epitaxial layer 31, and an element isolation layer 13 is formed as a p-type high concentration region to extend over the epitaxial layer 31.

Next, details of the photo diode 111 will be explained with reference to FIG. 2A and FIG. 3 hereunder.

The photo diode 111 consists of an n-type buried layer (one conductivity type buried layer, first buried layer) 32 buried in the epitaxial layer 31 to come into contact with the substrate 11, a low concentration n-type well layer (one conductivity type region) 12 formed on the n-type buried layer 32, a p-type first well region 15a formed on a surface layer of the n-type well layer 12, and an n-type impurity region 17 formed on the surface layer of the n-type well layer 12 such that its most region can overlap with the p-type first well region 15a.

This photo diode 111 is characterized in that the n-type buried layer 32 having the relatively high impurity concentration is provided on the overall region formed between the substrate 11 and the n-type well layer 12 and that the overall n-type layers (first semiconductor layer) 12 and 32 under the first well region 15a are formed thick.

Figure 5:
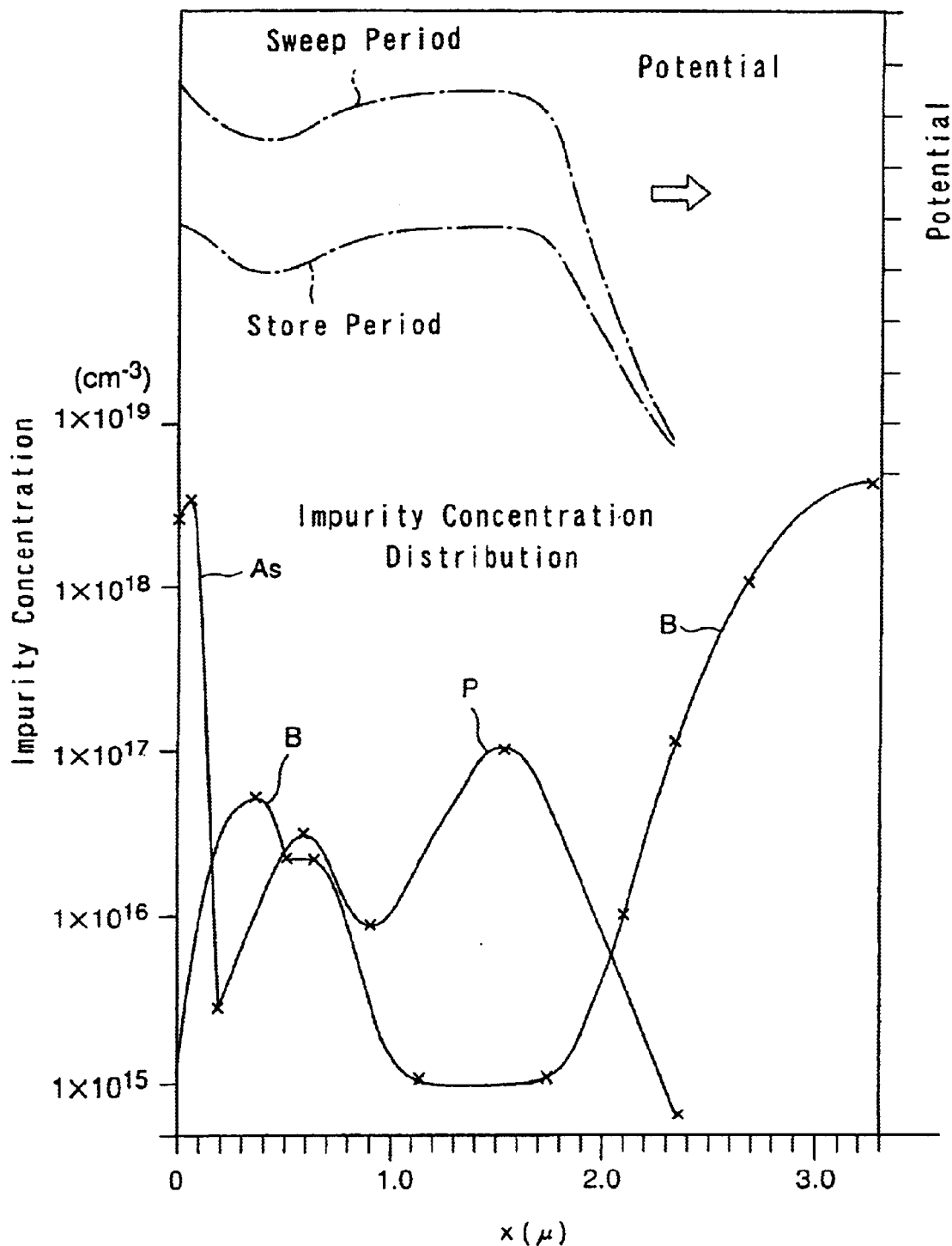
FIG. 5 is a graph showing an impurity concentration distribution and a potential distribution in the depth direction along a IV—IV line in FIG. 2, in the photo diode portion of the solid state imaging device according to the first embodiment of the present invention.

An impurity concentration distribution of this case is shown in FIG. 5. FIG. 5 is a graph showing an impurity concentration distribution and a potential distribution in the depth direction along a IV—IV line in FIG. 2, in the center portion of the photo diode 111. An abscissa denotes a depth ($\mu$m) from a surface of the semiconductor substrate in a linear scale, and an ordinate on the left side denotes an impurity concentration ($cm^{-3}$) in a logarithmic scale and an ordinate on the right side denotes potential (arbitrary unit) in a linear scale.

As shown in the impurity concentration distribution of FIG. 5, a thickness of the n-type buried layer 32 is almost 1 $\mu$m and a thickness of the n-type layer 12 under the first well region 15a is almost 0.5 $\mu$m. Thus, the thickness of the n-type layers 12 and 32 under the first well region 15a are almost 1.5 $\mu$m.

The above thickness of the n-type layers 12 and 32 under the first well region 15a, the impurity concentration distribution, its peak value, and a depth of a peak position are selected to be optimal when a voltage applied in a store period is about 2 to 3 V. The thickness of the n-type layer 12 and the n-type buried layer 32 under the first well region 15a, the impurity concentration distribution, the peak value, and the depth of the peak position are set such that a depletion layer can be spread sufficiently into the overall n-type layers 12 and 32 by the applied voltage mainly in the store period of carriers and the light receiving sensitivity of the red light can be enhanced sufficiently. Accordingly, these values may be changed appropriately depending upon a thickness of the first well region 15a, an impurity concentration distribution, its peak value, and a depth of a peak position, an attenuation characteristic of the red-color in the semiconductor, or a value of the voltage applied in the store period of the carriers.

In the photo diode 111 having the above structure, the n-type impurity region 17 is connected to the drain voltage supply line 22 in the above store period and biased to a positive potential. At this time, the depletion layer can spread from a boundary surface between the impurity region 17 and the first well region 15a to the overall first well region 15a to reach the n-type layer 12. In contrast, the depletion layer can spread from a boundary surface between the substrate 11 and the n-type buried layer 32 to all the n-type buried layer 32 and the overlying n-type well layer 12 to reach the first well region 15a.

The potential distribution at this time is shown in FIG. 5. Since the photo diode 111 portion has the above impurity concentration distribution, the first well region 15a and the n-type layers 12 and 32 have the potential distribution in which the potential is gradually reduced from the substrate 11 side to the surface side. Therefore, the holes generated by the light in the first well region 15a and the n-type layers 12 and 32 do not flow to the substrate 11 side, but stay in the first well region 15a and the n-type layers 12 and 32. Since the first well region 15a and the n-type layers 12 and 32 are connected to the gate region 15b of the light signal detecting MOS transistor 112, these holes generated by the light can be effectively utilized as the charges to modulate the threshold voltage of the light signal detecting MOS transistor 112. In other words, all the first well region 15a and the n-type layers 12 and 32 can act as the carrier generating region by the light.

In this manner, because the n-type buried layer 32 is provided, a total thickness of the carrier generating region of the photo diode 111 becomes thick. Accordingly, when the light is irradiated to the photo diode 111, such carrier generating region can act as the light receiving portion that has the good sensitivity to the light having a long wavelength, like the red color, which comes up to a deep inside of the light receiving portion.

Also, the photo diode 111 has the buried structure for the holes generated by the light in the meaning that the carrier generating region by the light is arranged under the impurity region 17 in the above photo diode 111. Therefore, the noise reduction can be achieved without the influence of the surface of the semiconductor layer which has many interface trap levels.

Next, details of the light signal detecting MOS transistor (nMOS) 112 will be explained with reference to FIGS. 2A and 2B and FIG. 4 hereunder.

The MOS transistor 112 of the first embodiment has a structure that the $n^+$-type drain region 17a surrounds an outer periphery of the ring-like gate electrode 19. The $n^+$-type drain region 17a is formed integrally with $n^+$-type impurity region 17. Also, the $n^+$-type source region 16a is formed to be surrounded by the ring-like gate electrode 19. In other words, the gate electrode 19 is formed on the second well region 15b between the drain region 17a and the source region 16a via a gate insulating film 18. A surface layer of the second well region 15b formed under the gate electrode 19 acts as the channel region.

In addition, in order to hold the channel region at its inverted state or its depletion state in the normal operation voltage, a channel doped layer 15c is formed by introducing the n-type impurity having an appropriate concentration into the channel region.

The $p^+$-type carrier pocket (high concentration buried layer) 25 is formed in a partial area over the channel length direction in the second well region 15b under the channel region, i.e., in a peripheral area of the source region 16a to surround the source region 16a. This $p^+$-type carrier pocket 25 can be formed by the ion implantation method, for example. The carrier pocket 25 is formed in the second well region 15b which is positioned deeper than the channel region. It is desired that the carrier pocket 25 should be formed not to overlap with the channel region.

Since the potential against the light emitting holes out of the light emitting charges is lowered in the above $p^+$-type carrier pocket 25, the light emitting holes can be collected into the carrier pocket 25 when a voltage higher than the gate voltage is applied to the drain region 17a.

The potential in the state that the light emitting holes are stored in the carrier pocket 25 and the electrons are induced in the channel region to thus form the inversion region is shown in FIG. 2B. The threshold voltage of the light signal detecting MOS transistor 112 is changed by the stored charges. Accordingly, detection of the light signal can be performed by detecting the change in the threshold voltage.

Figure 6:
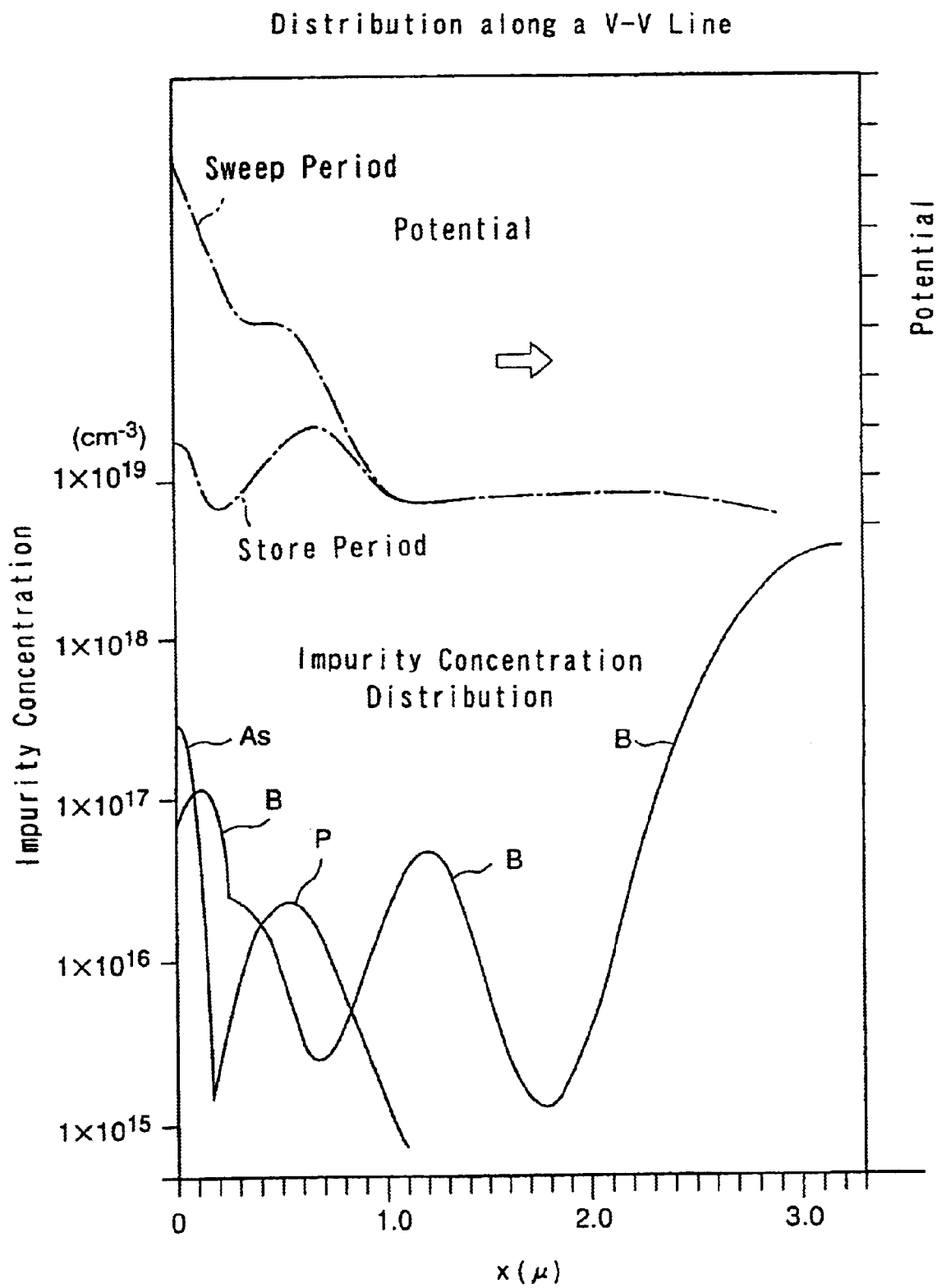
FIG. 6 is a graph showing an impurity concentration distribution and a potential distribution in the depth direction along a V—V line in FIG. 2 crossing the carrier pocket, in the light signal detecting MOS transistor portion of the solid state imaging device according to the first embodiment of the present invention.

FIG. 6 is a graph showing an impurity concentration distribution and a potential distribution in the depth direction along a V—V line in FIG. 2 crossing the carrier pocket 25 portion in the light signal detecting MOS transistor 112.

An abscissa denotes the depth ($\mu$m) from the surface of the semiconductor substrate in a linear scale, and an ordinate on the left side denotes the impurity concentration ($cm^{-3}$) in a logarithmic scale and an ordinate on the right side denotes the potential (arbitrary unit) in a linear scale.

As indicated by the impurity concentration distribution of FIG. 6, it is characterized that a p-type buried layer (second buried layer) 33 of high impurity concentration is provided between the substrate 11 and the n-type well layer 12. In other words, an n-type layer (third semiconductor layer) under the second well region 15b coincides with the n-type well layer 12, and thus a boundary between the n-type layer and the p-type buried layer 33 is positioned at a depth of about 0.8 µm from the surface. A thickness of the n-type layer under the second well region 15b is about 0.4 µm, which is thinner than the about 1.5 µm thickness of the n-type layers (first semiconductor layer) 12 and 32 below the first well region 15a in the photo diode 111 portion.

Also, a peak position of the impurity concentration of the p-type buried layer 33 is positioned at a depth of about 1.1 µm, and the impurity concentration at the peak position is almost $5 \times 10^{16}$ cm$^{-3}$.

The thicknesses of the n-type layer 12 and the p-type buried layer 33 under the second well region 15b, the impurity concentration distribution, the peak value, and the depth of the peak position are set to be optimal when a reset voltage is set to 7 to 8 V. The impurity distribution and the depth of the n-type layer 12 and the p-type buried layer 33 are set such that the depletion layer, mainly in the carrier sweep period (initialization period), can spread into the second well region 15b rather than the p-type buried layer 33 to concentrate the electric field in the second well region 15b. Accordingly, these values may be changed appropriately depending upon a thickness of the second well region 15b, an impurity concentration distribution in the region 15b, its peak value, and a depth of a peak position, or a value of the voltage (reset voltage) applied in the carrier sweep period (initialization period).

In this case, the carrier pocket 25 is formed at a depth of about 0.2 µm, and the peak value of the impurity concentration is set to about $1 \times 10^{17}$ cm$^{-3}$. The thickness of the carrier pocket 25, a peak value of its impurity concentration, and a depth of its peak position are set such that the potential to store sufficiently the carriers in the carrier pocket can be obtained in the store period and the read period mainly and that the carrier storing state in the carrier pocket 25 can have an enough effect on the channel region in the read period. Accordingly, these values may be changed appropriately depending upon a state of the impurity concentration distribution of the first well region 15a serving as the background of the carrier pocket 25, an impurity concentration of the channel doped layer, the applied voltage in the store period, the applied voltage in the read period, etc.

By the way, in the above carrier sweep period, the carriers remained in the second well region 15b are swept to the substrate 11 side by the electric field which is generated by applying the high voltage to the gate electrode 19, the source region 16a, and the drain region 17a. In this case, the depletion layer spreads from a boundary surface between the channel doped layer 15c in the channel region and the second well region 15b into the second well region 15b by the applied voltage, and also the depletion layer spreads from a boundary surface between the p-type buried layer 33 and the n-type well layer 12 into the n-type well layer 12 under the second well region 15b.

As a result, the electric field generated by the voltage applied to the gate electrode 19 extends mainly over the second well region 15b and the n-type well layer 12 formed under the second well region 15b.

In the case of the present invention, the n-type well layer 12 under the second well region 15b is small in thickness and the high concentration p-type buried layer 33 is formed in the neighborhood of the n-type well layer 12 on the substrate 11 side. For this reason, the depletion layer that spreads from a boundary surface between the p-type buried layer 33 and the n-type well layer 12 into the n-type well layer 12 in the seep period becomes small in thickness.

More particularly, as indicated by the potential distribution of FIG. 6, the voltage supplied from the gate electrode 19 is applied mainly to the second well region 15b. In other words, since the abrupt potential change is caused in the second well region 15b and thus the strong electric field that can sweep out the holes to the substrate 11 side is mainly applied to the second well region 15b, the carriers stored in the carrier pocket 25 and the second well region 15b can be swept by the low reset voltage without fail, whereby a reset efficiency can be improved.

Figure 8:
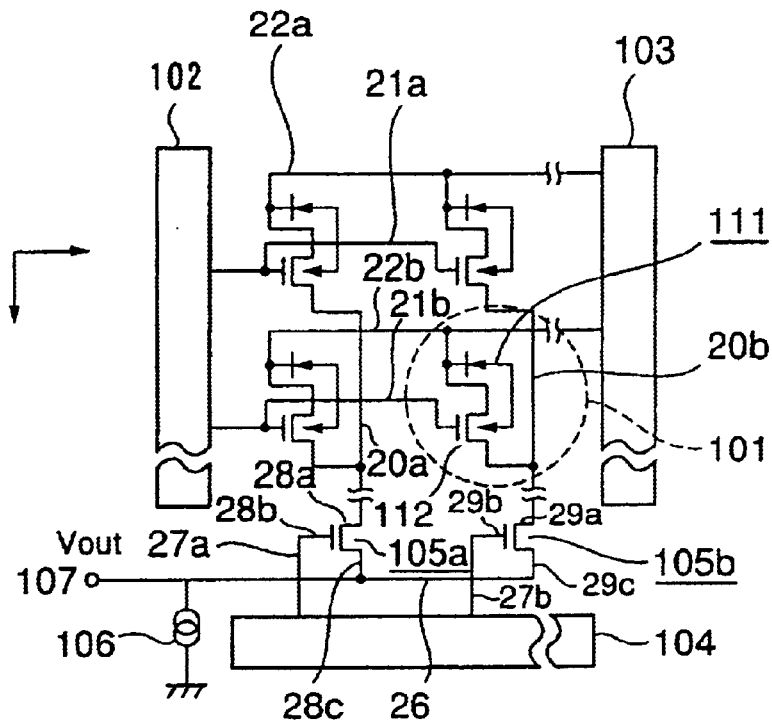
FIG. 8 is a view showing an overall circuit configuration of the solid state imaging device according to the first embodiment of the present invention.

Next, an overall configuration of the MOS image sensor using the unit pixel having the above structure will be explained with reference to FIG. 8 hereunder. FIG. 8 shows a circuit configuration of the MOS image sensor according to the first embodiment of the present invention.

As shown in FIG. 8, this MOS image sensor has a two-dimensional array sensor configuration in which the unit pixels having the above structure are aligned in the column direction and the row direction in a matrix fashion.

Also, a vertical scanning signal (VSCAN) drive scanning circuit 102 and a drain voltage (VDD) drive scanning circuit 103 are arranged on the right and left sides to put the pixel region between them.

Vertical scanning signal supply lines 21a, 21b are extended from the vertical scanning signal drive scanning circuit 102 one by one every row. The vertical scanning signal supply lines 21a, 21b are connected to the gates of the MOS transistors 112 in all unit pixels 101 along the row direction.

Also, drain voltage supply lines (VDD supply lines) 22a, 22b are extended one by one every row from the drain voltage drive scanning circuit 103. The every drain voltage supply line 22a, 22b is connected to the drains of the light signal detecting MOS transistors 112 in all unit pixels 101 along the row direction.

Also, different vertical output lines 20a, 20b are provided every column. The vertical output lines 20a, 20b are connected to sources of the MOS transistors 112 in all unit pixels 101 aligned along the column direction respectively.

In addition, MOS transistors 105a, 105b acting as different switches are provided every column. The vertical output lines 20a, 20b are connected to drains (light detecting signal input terminals) 28a, 29a of the MOS transistors 105a, 105b one by one. Gates (horizontal scanning signal input terminals) 28b, 29b of the switches 105a, 105b are connected to a horizontal scanning signal (HSLAN) drive scanning circuit 104.

Also, sources (light detecting signal output terminals) 28c, 29c of the switches 105a, 105b are connected to a video signal output terminal 107 via a common constant current source (load circuit) 106. In other words, the source of the MOS transistor 112 in the every unit pixel 101 is connected to the constant current source 106 to form a source follower circuit of the every unit pixel. Therefore, a potential difference between the gate and the source of the MOS transistor 112 and a potential difference between the bulk and the source are decided by the constant current source 106 connected thereto.

A video signal (Vout) that is in proportion to an incident amount of the light can be read by driving the MOS transistor 112 of the unit pixel sequentially by the vertical scanning signal (VSCAN) and the horizontal scanning signal (HSCAN).

Figure 9:
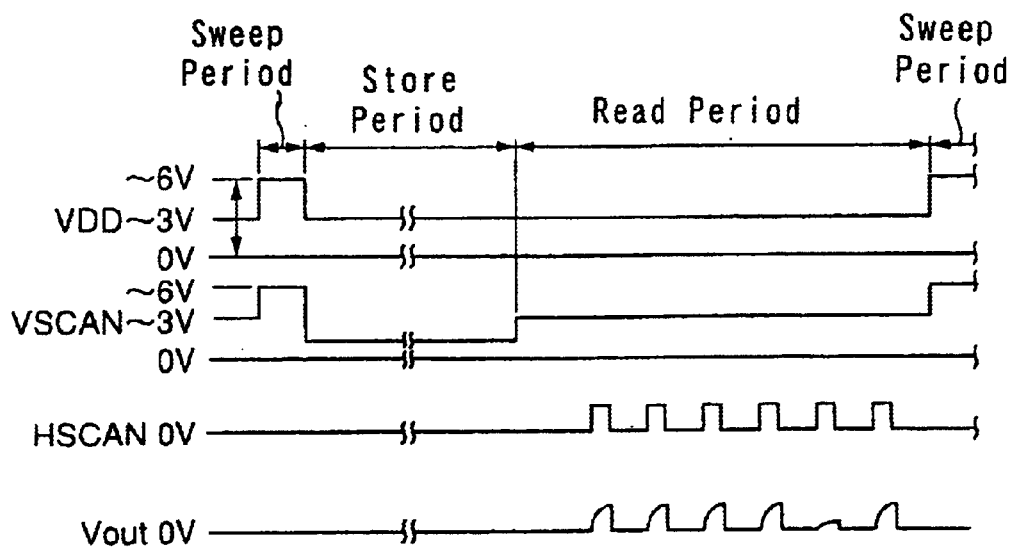
FIG. 9 is a timing chart when the solid state imaging device in FIG. 8 is operated.

FIG. 9 shows a timing chart of input/output signals to operate the MOS image sensor according to the present invention. The case is applied where the p-type well regions 15a, 15b are used and the light signal detecting transistor 112 is composed of NMOS.

As described above, the device operation is repeated such as the sweep period (initialization period)—the store period—the read period-the sweep period (initialization period)— . . . .

Next, a series of continuous light detecting operations of the solid state imaging device will be explained simply in compliance with FIG. 8 and FIG. 9.

First, the charges remaining in the carrier pocket 25 and the well regions 15a, 15b are exhausted by the initializing operation. More particularly, a high positive voltage of about 6 V is supplied to the drain of the light signal detecting MOS transistor 112 via the VDD supply lines 22a, 22b and supplied to the gate of the light signal detecting MOS transistor 112 via the VSCAN supply lines 21a, 21b. At this time, since the n-type well layer 12 under the second well region 15b is small in thickness and the high concentration p-type buried layer 33 comes into contact with the n-type well layer 12 on the substrate 11 side, the voltage applied to the gate electrode 19 is applied merely to the second well region 15b and its very close region. In other words, the abrupt change of the potential is caused in the second well region 15b, and thus the strong electric field for sweeping out the holes to the substrate 11 side is applied mainly to the second well region 15b. Therefore, the carriers can be swept out by the low reset voltage without fail, whereby the improvement of the reset efficiency can be achieved.

Then, the low gate voltage is applied to the gate electrode 19 of the light signal detecting MOS transistor 112, and the voltage (VDD) of about 2 to 3 V necessary for the transistor operation is applied to the drain region 17a. At this time, the first well region 15a, the n-type well region 12, and the n-type buried layer 32 are depleted and also the second well region 15b is depleted. Then, the electric field is generated to direct from the drain region 17a to the source region 16a.

Then, the light is irradiated onto the photo diode 111. At this time, the carrier generating region in the photo diode 111 portion is totally thick. Therefore, electron-hole pairs (light emitting charges) can be generated effectively with respect to the long wavelength light such as the red-color light which can reach the deep inside of the light receiving portion.

The light emitting holes out of the light emitting charges are injected into the gate region of the light signal detecting MOS transistor 112 by the above electric field and then stored in the carrier pocket 25. Accordingly, the width of the depletion layer that is extended from the channel region to the underlying gate region 15b is limited and also the potential in the neighborhood of the source region 16a is modulated, whereby the threshold voltage of the light signal detecting MOS transistor 112 is changed.

Figure 7:
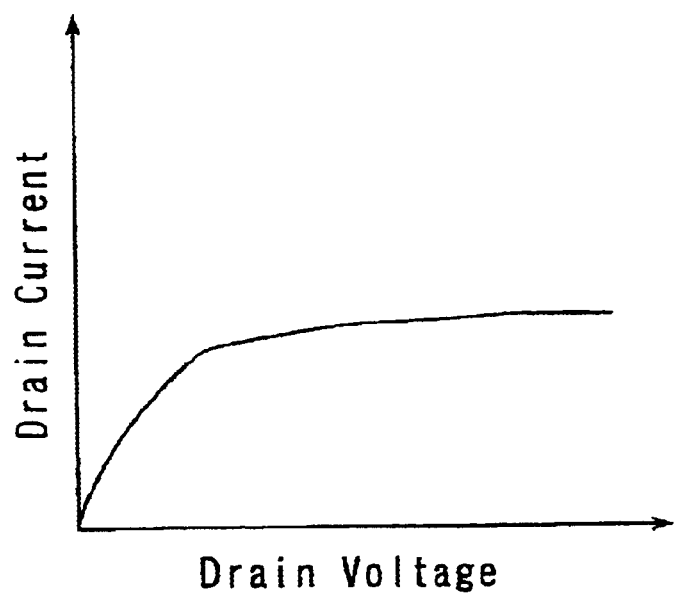
FIG. 7 is a graph showing a drain current-drain voltage characteristic of the light signal detecting MOS transistor of the solid state imaging device according to the first embodiment of the present invention.

Then, the gate voltage of about 2 to 3 V to operate the MOS transistor 112 in its saturation state is applied to the gate electrode 19, and the voltage VDD of about 2 to 3 V to operate the MOS transistor 112 is applied to the drain region 17a. Accordingly, a low electric field inversion region is formed in a part of the channel region over the carrier pocket 25 and also a high electric field region is formed in remaining portion of the channel region. At this time, as shown in FIG. 7, a drain current-drain voltage characteristic of the light signal detecting MOS transistor 112 exhibits the saturation characteristic.

Then, the constant current source 106 is connected to the source region 16 of the MOS transistor 112 to flow a constant current. Accordingly, since the MOS transistor 112 forms the source follower circuit, the source potential is changed to follow up the change of threshold voltage of the MOS transistor by the light emitting holes and thus change of the output voltage is brought about.

In this manner, the video signal (Vout) that is in proportion to an irradiation amount of the light can be picked up.

As described above, according to the first embodiment of the present invention, an ideal photoelectric conversion mechanism can be accomplished which does not interact with noise sources on the semiconductor surface and in the channel region when the light emitting holes are drifted in a series of processes of the sweeping operation (initialization)—the storing operation-the reading operation.

Also, since the transistor can be operated in its saturation state, as shown in FIG. 7, by the charge accumulation into the carrier pocket 25 and also the source follower circuit is formed, the change of the threshold voltage due to the light emitting charges can be detected as the change in the source potential. As a result, the photoelectric conversion can be achieved with good linearity.

Next, a method of manufacturing the solid state imaging device having the above configuration will be explained with reference to FIG. 10A to FIG. 10R hereunder.

In this case, an actual circuit configuration is complicated and is different from planar arrangement of the elements described in the following. In FIG. 10A to FIG. 10R, for convenience of explanation of the manufacturing method, major elements are schematically shown to illustrate how to form different device structures in a series of manufacturing steps. The major elements are picked up out of all elements employed in this circuit and have a different structure each other. As types of the selected elements, p-CMOS (p-channel MOS of Complementary Metal Oxide Semiconductor) as a peripheral circuit device, n-CMOS (n-channel MOS of CMOS), enhancement n-MOS, depletion n-MOS, and VMIS as the optical sensor are illustrated from the left side of figures.

Figure 10A:
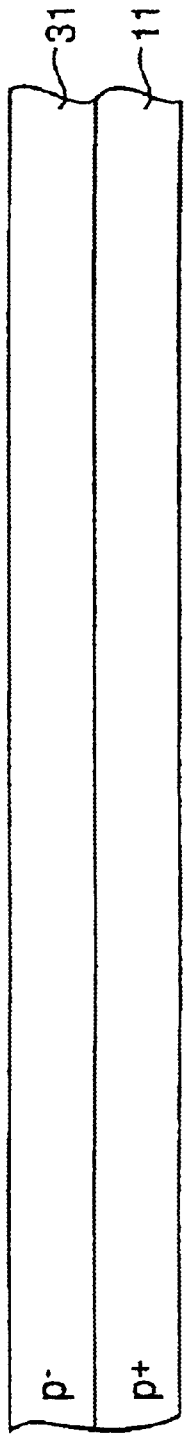
FIG. 10A to FIG. 10R are sectional views showing a method of manufacturing the solid state imaging device according to the first embodiment of the present invention.

First, as shown in FIG. 10A, an epitaxial layer 31 of about 3 μm thickness is formed by epitaxial-growing p-type silicon whose impurity concentration is about $1 \times 10^{15}$ cm$^{-3}$ on a p-type silicon substrate 11 whose impurity concentration is about $4 \times 10^{18}$ cm$^{-3}$. The substrate 11 constitutes an entire part of a first base layer and a part of a second base layer, and the epitaxial layer 31 constitutes a part of the second base layer.

Figure 10B:
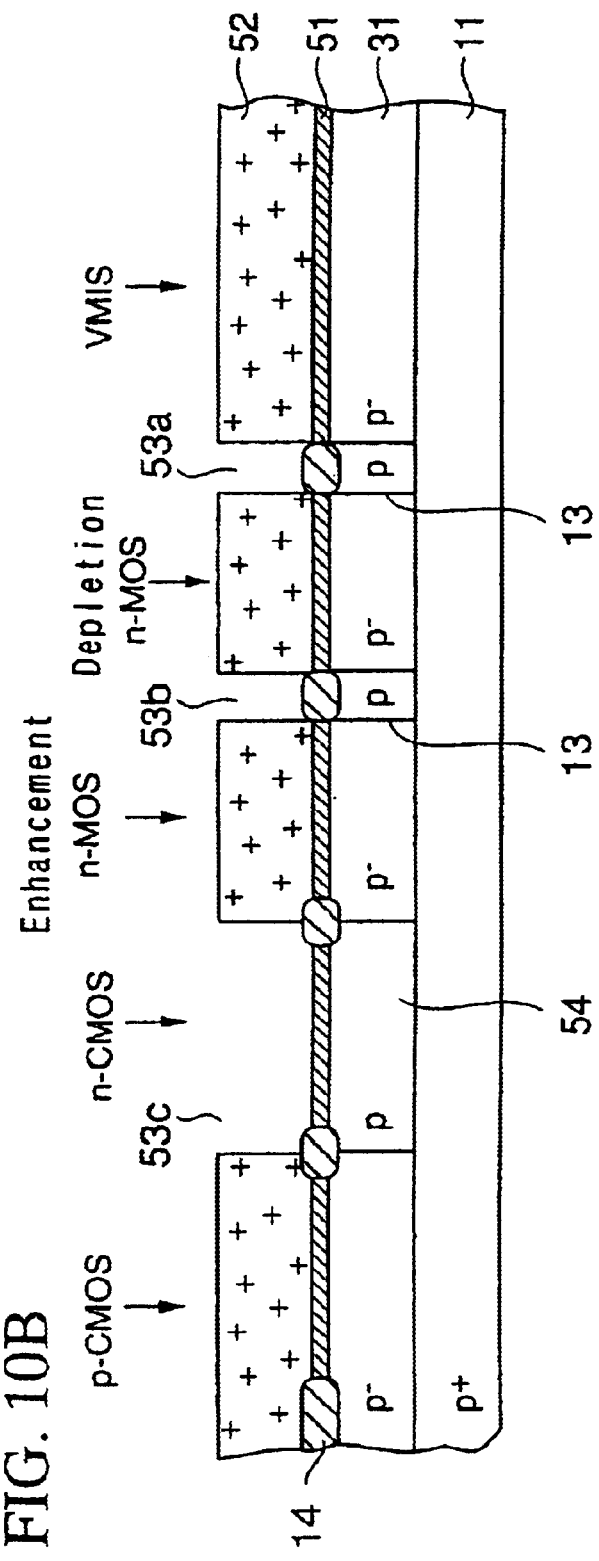

Then, as shown in FIG. 10B, a field insulating film 14 is formed in the element isolation region by LOCOS (LOCal Oxidation of Silicon). Then, a pad insulating film 51 is formed in the element forming region that is surrounded by the element isolation region.

Then, a resist mask 52 that has opening portions 53a, 53b in the element isolation region between the enhancement n-MOS and the depletion n-MOS and the element isolation region between the depletion n-MOS and the VMIS respectively and has an opening portion 53c to spread over the n-CMOS forming region is formed. In turn, the p-type impurity is ion-implanted via the opening portions 53a, 53b, 53c of the resist mask 52 and the field insulating film 14. Therefore, p-type element isolation layers 13 are formed in the epitaxial layer 31 under the field insulating film 14 between the enhancement n-MOS and the depletion n-MOS and between the depletion n-MOS and the VMIS to reach the substrate 11, and also a p-type well layer 54 is formed in the epitaxial layer 31 spreading over the n-CMOS forming region to reach the substrate 11.

Figure 10C:
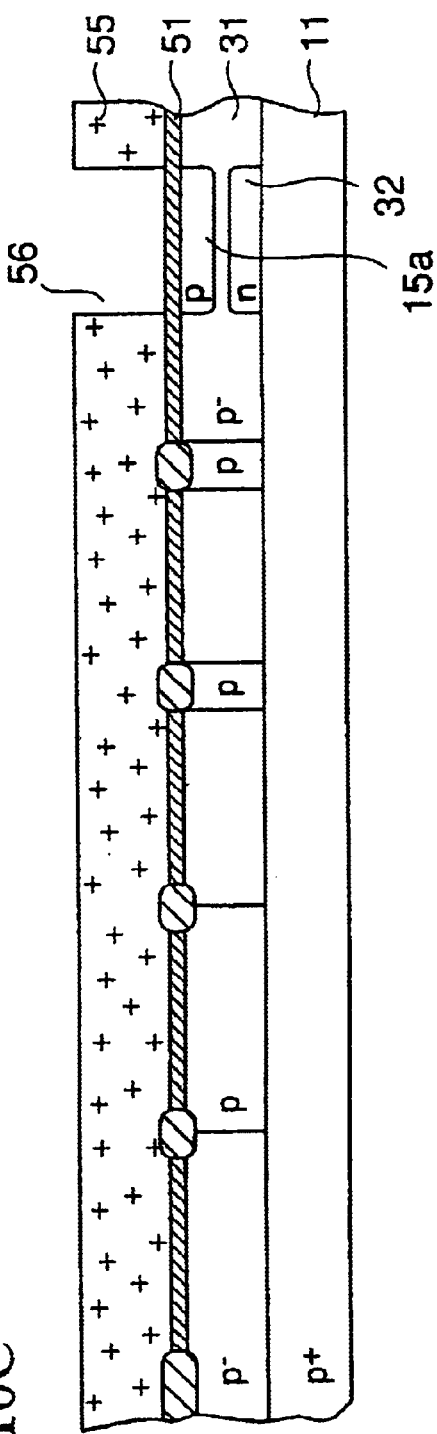

Then, as shown in FIG. 10C, a resist mask (first mask) 55 with an opening portion 56 in the photo diode 111 forming region in the VMIS forming region is formed. In turn, P31+ as the n-type impurity is ion-implanted deeply through the opening portion 56 of the resist mask 55 via the pad insulating film 51, and then B11+ as the p-type impurity is ion-implanted two times shallowly through the same opening portion 56. Therefore, as shown in FIG. 5, an n-type buried layer (first buried layer) 32 with a peak position of about 1.5 μm and a peak impurity concentration of about $1\times10^{17}$ cm$^{-3}$ is formed to come into contact with the substrate 11, and a p-type well layer 15a with a peak position of about 0.3 μm and a peak impurity concentration of about $6\times10^{16}$ cm$^{-3}$ and with another peak position of about 0.55 μm and another peak impurity concentration of about $2\times10^{16}$ cm$^{-3}$ is formed over the n-type buried layer 32. This p-type well layer 15a acts as the first well region (second semiconductor layer) having the width being substantially same as the n-type buried layer 32. This n-type buried layer 32 constitutes a part of the first semiconductor layer.

Figure 10D:
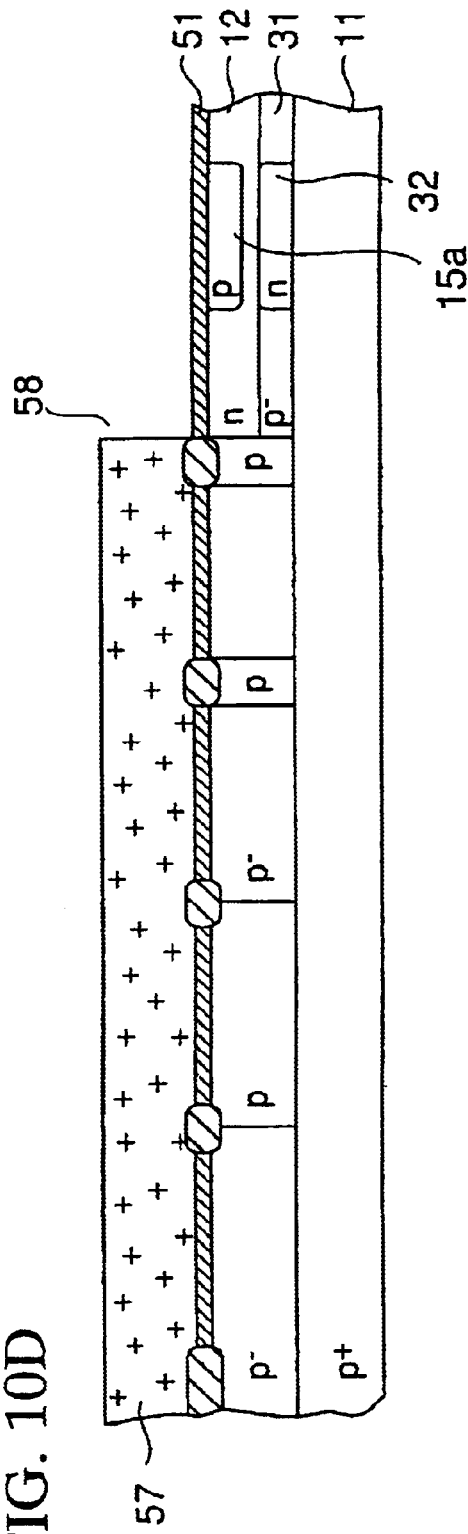

Then, as shown in FIG. 10D, a resist mask 57 that has an opening portion 58 to extend over an entire area of the VMIS forming region is formed. In turn, the n-type impurity is ion-implanted through the opening portion 58 of the resist mask 57. Therefore, an n-type well layer (opposite conductivity type region) 12 with a peak position of about 0.55 μm and a peak impurity concentration of about $3\times10^{16}$ cm$^{-3}$ is formed to contain the overall first well region 15a and to reach the n-type buried layer 32 at its bottom end. This n-type well layer 12 constitutes a part of the first semiconductor layer and the overall third semiconductor layer.

Then, after the step shown in FIG. 10D, a gate insulating film may also be formed by removing the pad insulating film 51 and then re-oxidizing the surface of the semiconductor substrate. In FIG. 10D, the pad insulating film 51 and the gate insulating film being formed by the re-oxidation are denoted together by the same reference number 51. In this case, preferably the gate insulating film is set to the thickness of less than 60 nm. This is because, if the thickness is set thicker than this value, it is difficult to get the sharp impurity concentration distribution when the high concentration buried layer 25 is formed by the ion implantation.

Figure 10E:
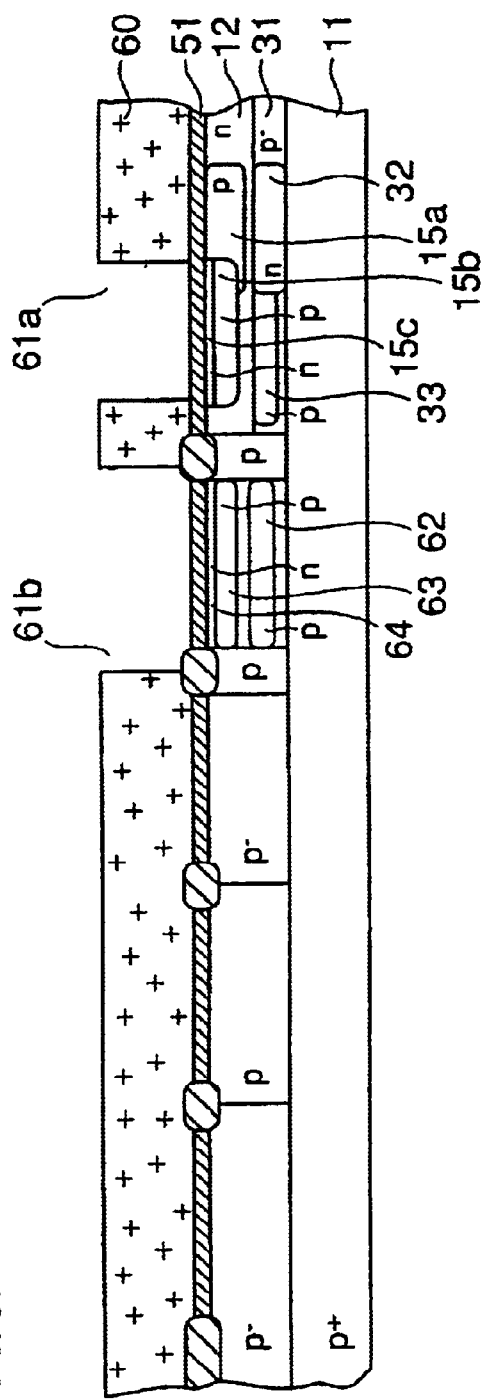

Then, as shown in FIG. 10E, a resist mask (second mask) 60 that has an opening portion 61a in the forming region of the light signal detecting MOS transistor 112 in the VMIS forming region and has an opening portion 61b to extend over the overall depletion n-MOS forming region is formed. In turn, B11+ as the p-type impurity is ion-implanted deeply through the opening portions 61a and 61b of the resist mask 60, and then B11+ as the p-type impurity is ion-implanted shallowly through the same opening portions 61a and 61b. In addition, As+ as the n-type impurity is ion-implanted shallowly through the same opening portions 61a and 61b.

Accordingly, a p-type buried layer 62, a p-type well layer 63, and a channel doped layer 64 are formed in the depletion n-MOS forming region. In contrast, as shown in FIG. 6, a p-type buried layer (second buried layer) 33 with a peak position of about 1.2 μm and a peak impurity concentration of about $5\times10^{16}$ cm$^{-3}$, a second well region 15b with a peak position of about 0.1 μm and a peak impurity concentration of about $1.2\times10^{17}$ cm$^{-3}$, and an n-type channel doped layer 15c with a surface concentration of about $2\times10^{17}$ cm$^{-3}$ are formed in the VMIS forming region. The p-type buried layer 33 constitutes a part of the second base layer.

Figure 10F:
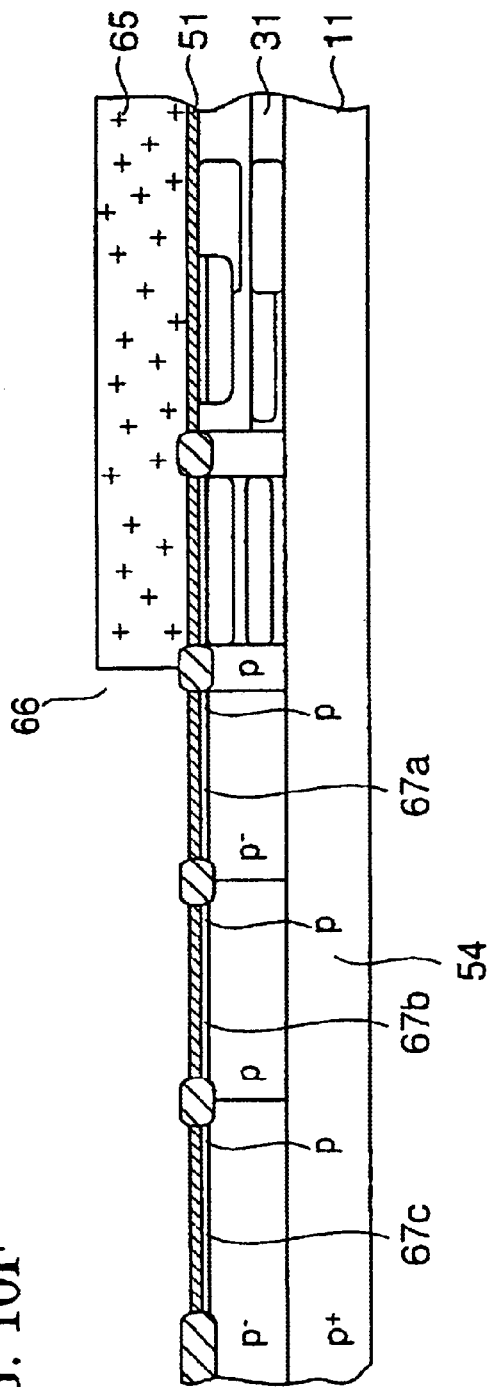

Then, as shown in FIG. 10F, a resist mask 65 that has an opening portion 66 over all the p-CMOS forming region, the n-CMOS forming region, and the enhancement n-MOS forming region is formed. In turn, the p-type impurity is shallowly ion-implanted via the opening portion 66 of the resist mask 65. Therefore, the p-type channel doped layers 67a to 67c are formed.

Figure 10G:
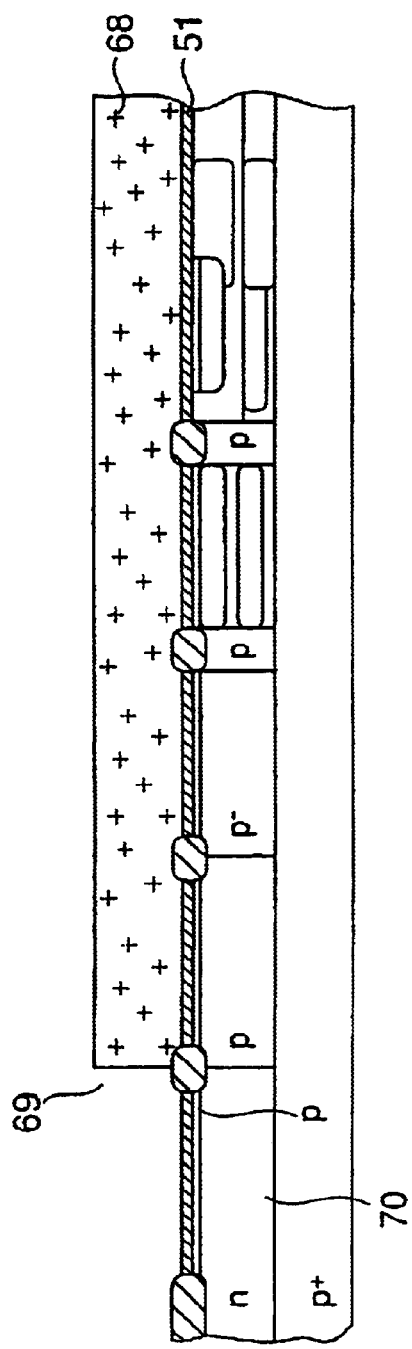

Then, as shown in FIG. 10G, a resist mask 68 that has an opening portion 69 in the p-CMOS forming region is formed. Then, an n-type well layer 70 is formed by ion-implanting the n-type impurity via the opening portion 69 of the resist mask 68.

Figure 10H:
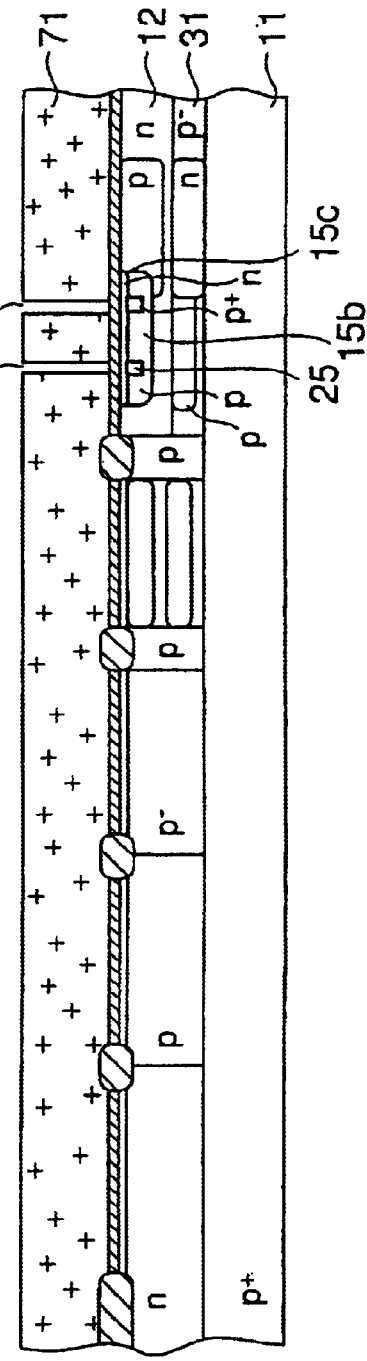

Then, as shown in FIG. 10H, a resist mask (third mask) 71 that has an opening portion 72 in the region serving as the carrier pocket (high concentration buried layer) 25 of the light signal detecting MOS transistor in the VMIS forming region is formed. In turn, B11+ as the p-type impurity is ion-implanted via the opening portion 72 of the resist mask 71. Therefore, as shown in FIG. 6, a p$^+$-type high concentration buried layer 25 with a peak position of about 0.2 μm and a peak impurity concentration of about $1\times10\mu17$ cm$^{-3}$ is formed in the second well region 15b under the channel doped layer 15c.

Figure 10I:
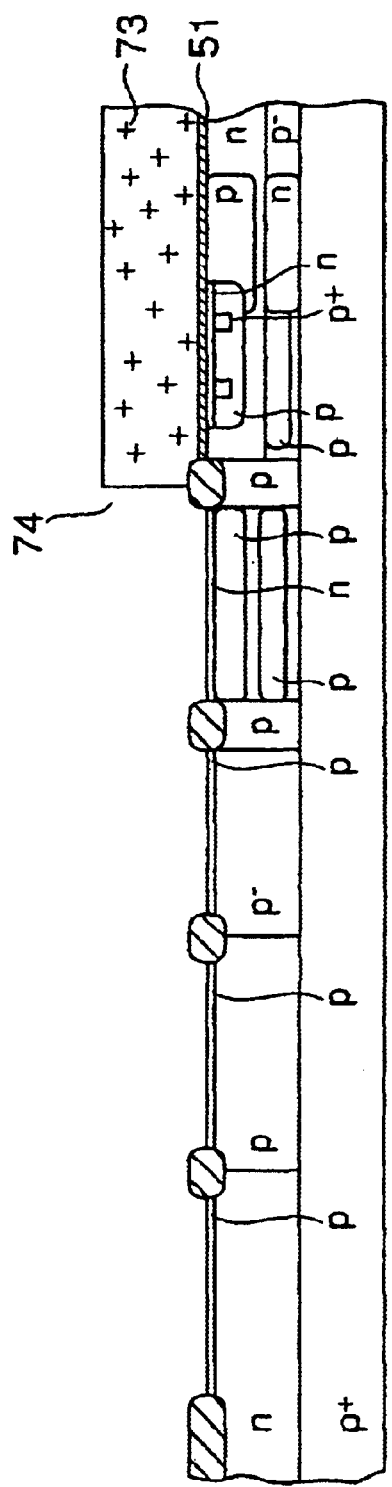

Then, as shown in FIG. 10I, a resist mask 73 that has an opening portion 74 to extend over all the p-CMOS forming region, the n-CMOS forming region, the enhancement n-MOS forming region, and the depletion n-MOS forming region is formed. In turn, the gate oxide film 51 is removed via the opening portion 74 of the resist mask 73, and the original gate oxide film 51 is left in the VMIS forming region.

Figure 10J:
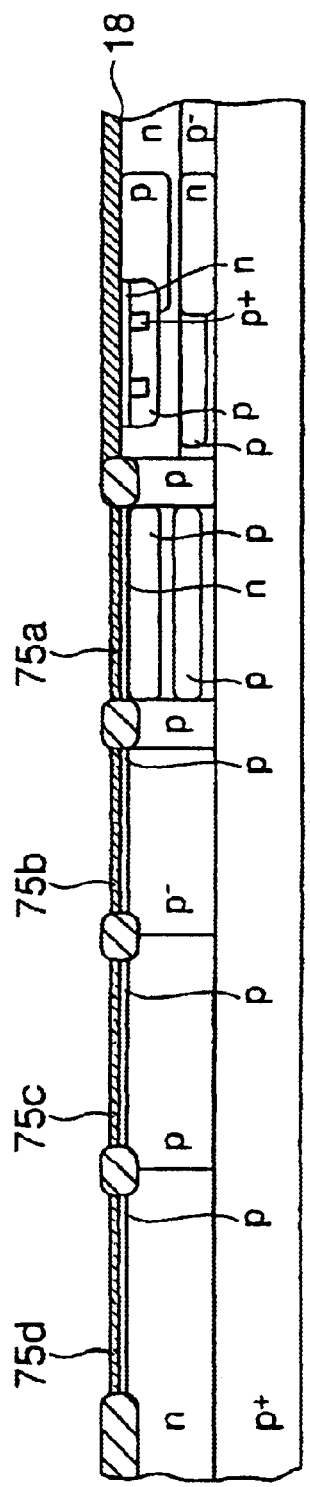

Then, as shown in FIG. 10J, after the resist mask 73 is removed, the surface of the semiconductor substrate is thermally oxidized. Therefore, thin gate oxide films 75a to 75d are formed in the p-CMOS forming region, the n-CMOS forming region, the enhancement n-MOS forming region, and the depletion n-MOS forming region, and also a thick gate insulating film 18 is formed on the surface of the VMIS forming region since a thickness of a new oxide film is further added to the thickness of the oxide film being left in the preceding step. Thus, the gate capacity can be reduced by increasing the thickness of the gate insulating film 18 in the VMIS forming region, so that the detecting sensitivity of the light emitting charges stored in the high concentration buried layer, in turn, the light signal detecting sensitivity can be improved.

Figure 10K:
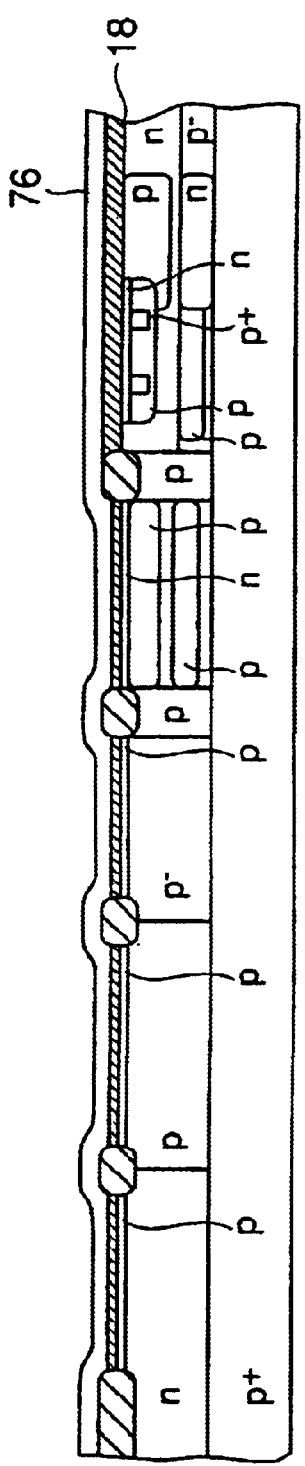

Then, as shown in FIG. 10K, a polysilicon film 76 is formed on an overall surface.

Figure 10L:
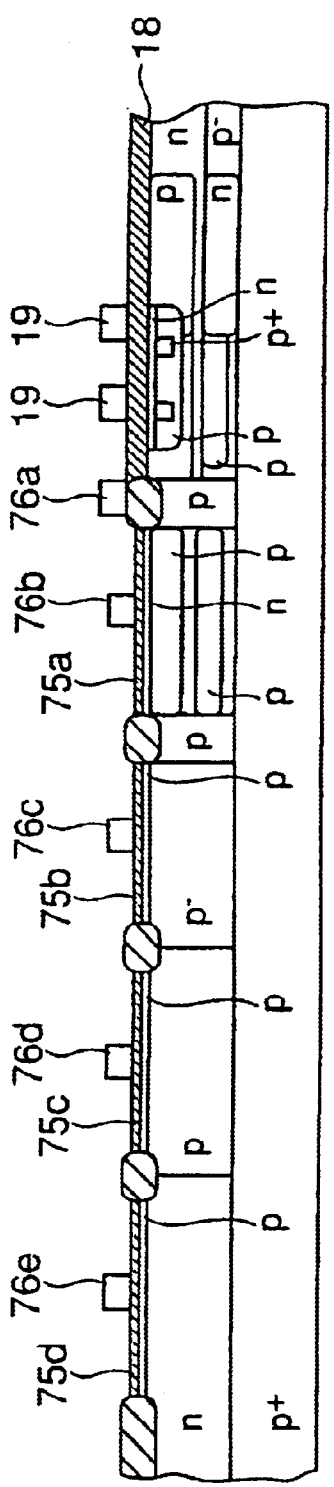

Then, as shown in FIG. 10L, gate electrodes 76a to 76e, 19 are formed in respective MOS forming regions by patterning the polysilicon film 76.

Figure 10M:
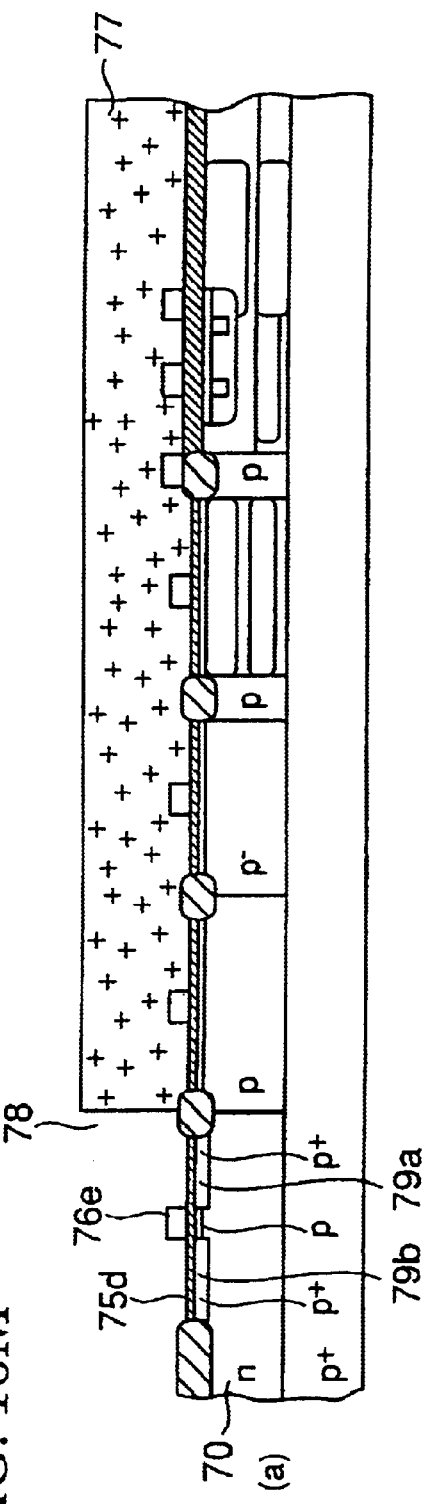

Then, as shown in FIG. 10M, a resist mask 77 that has an opening portion 78 to extend over the entire p-CMOS forming region is formed. Then, the p-type impurity is ion-implanted via the opening portion 78 of the resist mask 77 by using the gate electrode 76e as a mask. Therefore, source/drain regions 79a and 79b are formed in the n-type well layer 70 on both sides of the gate electrode 76e.

Figure 10N:
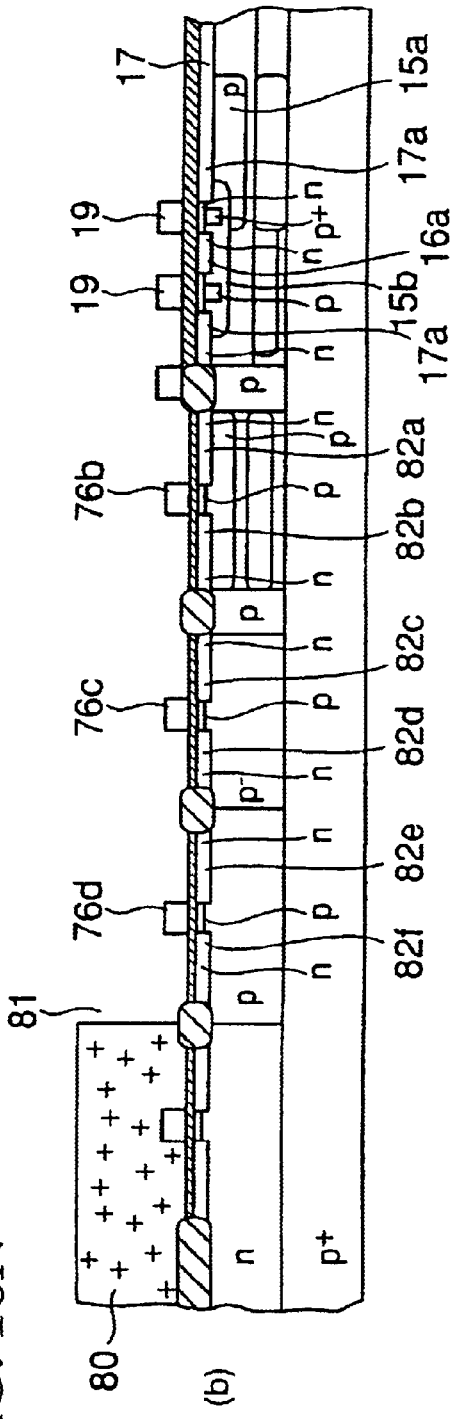

Then, as shown in FIG. 10N, a resist mask 80 that has an opening portion 81 to extend over all the n-CMOS forming region, the enhancement n-MOS forming region, the depletion n-MOS forming region, and the VMIS forming region is formed. Then, the n-type impurity is ion-implanted via the opening portion 81 of the resist mask 80 by using the gate electrodes 76b to 76d, 19 as a mask. Therefore, source/drain regions 82a and 82b, 82c and 82d, 82e and 82f, 16a and 17a are formed on both sides of the gate electrodes 76b to 76d, 19 in respective forming regions.

Figure 10O:
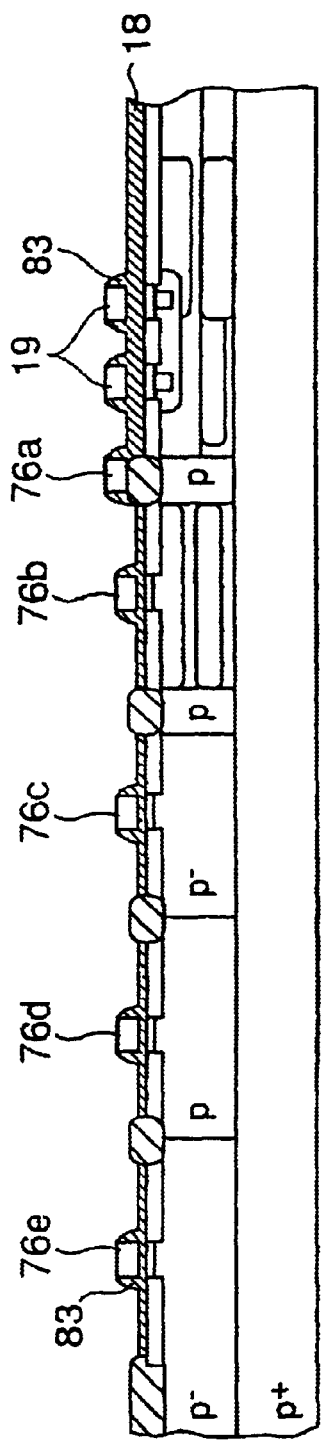

Then, as shown in FIG. 10O, the resist mask 80 is removed and then an insulating film is formed by the CVD (Chemical Vapor Deposition) method, etc. In turn, sidewalls 83 are formed on side surfaces of the gate electrodes 76a to 76e, 19 by the anisotropic etching.

Figure 10P:
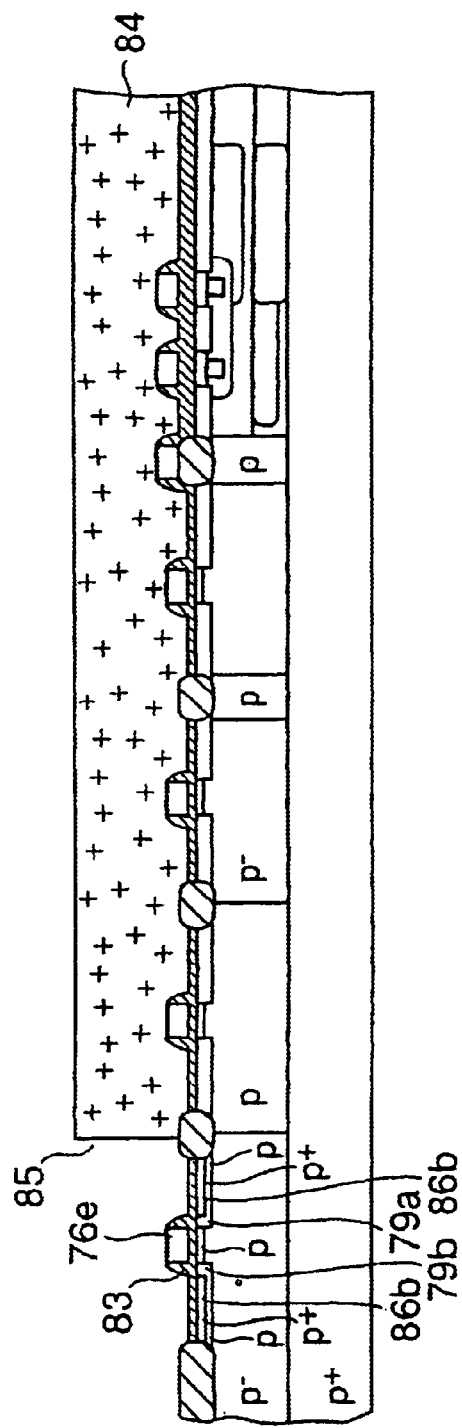

Then, as shown in FIG. 10P, a resist mask 84 that has an opening portion 85 in the p-CMOS forming region is formed. In turn, the p-type impurity is ion-implanted via the opening portion 85 of the resist mask 84 by using the gate electrode 76e and the sidewalls 79 as a mask. Therefore, contact layers 86a and 86b are formed in the source/drain regions 79a and 79b respectively.

Figures 10Q, 10R:
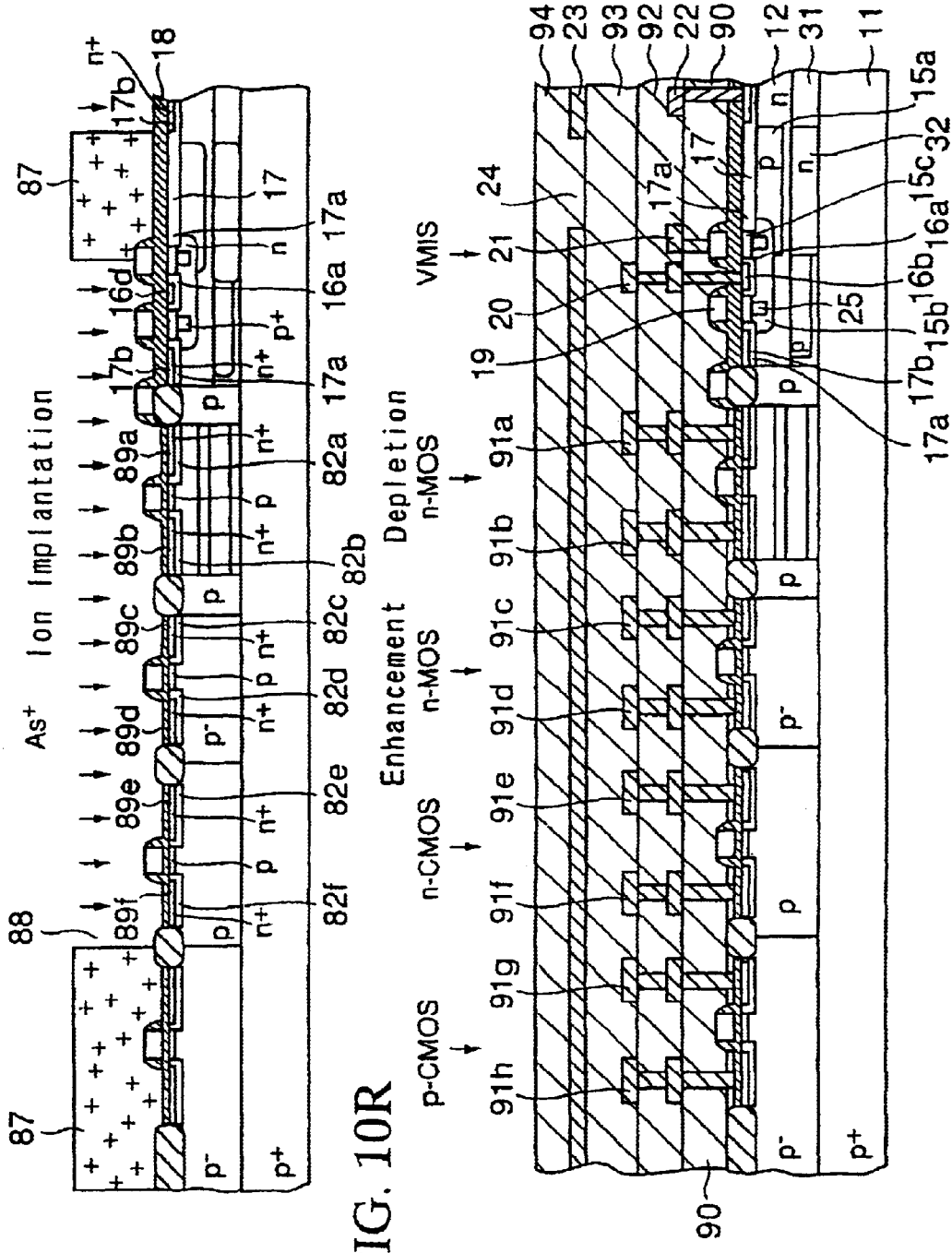

Then, as shown in FIG. 10Q, a resist mask 87 that has an opening portion 88 to extend over all the n-CMOS forming region, the enhancement n-MOS forming region, the depletion n-MOS forming region and has an opening portion 88 in the light signal detecting MOS transistor 112 portion and the photo diode 111 portion in the VMIS forming region is formed. Thereafter, the n-type impurity is ion- implanted via the opening portion 88 of the resist mask 87. Therefore, contact layers 89a and 89b, 89c and 89d, 89e and 89f, 16b and 17b are formed in the source/drain regions 82a and 82b, 82c and 82d, 82e and 82f, 16a and 17a in respective forming regions.

Then, as shown in FIG. 10R, after the resist mask 87 is removed, a first layer interlayer insulating film 90 is formed. Then, underlying source/drain electrodes or wiring layers 91a and 91b, 91c and 91d, 91e and 91f, 91g and 91h, 20 and 22 which are connected to the source/drain regions 82a and 82b, 82c and 82d, 82e and 82f, 79a and 79b, 16a and 17a in respective MOS forming regions, and a gate wiring layer 21 which are connected to the gate electrode 19 in the VMIS forming region are formed on the first layer interlayer insulating film 90.

In turn, after an interlayer insulating film 92 of a second layer is formed, overlying source/drain electrodes or wiring layers 91a and 91b, 91c and 91d, 91e and 91f, 91g and 91h, 20 which are connected to the underlying source/drain electrodes or wiring layers 91a and 91b, 91c and 91d, 91e and 91f, 91g and 91h, 20 in respective MOS forming regions are formed on the second layer interlayer insulating film 92.

In turn, after an interlayer insulating film 93 of a third layer is formed, a light shielding film 23 that has an opening portion (light receiving window) 24 in the photo diode 111 portion is formed on the interlayer insulating film 93. Then, a cover insulating film 94 to cover the overall surface of the device is formed, whereby the solid state imaging device can be completed.

As described above, according to the first embodiment of the present invention, since the unit pixel 101 consists of the photo diode 111 and the MOS transistor 112, the pixel portion can be fabricated by using the CMOS technology. Therefore, all the above pixel portion and the peripheral circuits such as the drive scanning circuits 102 to 104, the constant current source 106, etc. are fabricated on the same semiconductor substrate.

As a result, simplification of the manufacturing steps can be achieved and also size reduction of the solid state imaging device can be achieved by the integration of the circuit parts.

With the above, although the present invention is explained in detail based on the first embodiment, the scope of the present invention is not limited to the examples described particularly in the first embodiment. Thus, variation of the above first embodiment may be contained in the scope of the present invention without departing the gist of the present invention.

For example, the first well region 15a and the second well region 15b are formed separately, but they may be formed integrally at a time.

Also, the p-type epitaxial layer 31 is formed on the p-type substrate 11, but the n-type epitaxial layer may be formed on the p-type substrate 11. In this case, it is similar to the above embodiment that the n-type layer (first semiconductor layer) under the first well region 15a is formed thick but the n-type layer (third semiconductor layer) under the second well region 15b is formed thin.

In addition, although the p-type substrate 11 is used, the n-type substrate may be used. In this case, the light emitting carriers to be stored in the carrier pocket 25 are the electrons among the light emitting holes and the electrons. Thus, in order to achieve the similar advantages of the above embodiment, the conductivity type of respective layers and respective regions explained in the first embodiment should be inversed.

Further, the impurity concentration and the thickness of the n-type buried layer (first buried layer) 32 may be set to a concentration and a thickness such that the depletion layer can spread from a boundary surface between the substrate 11 and the n-type buried layer 32 to the overall n-type buried layer 32 by the voltage applied between the impurity region 17 and the substrate 11 in the store period.

Furthermore, the impurity concentration and the thickness of the p-type buried layer (second buried layer) 33 may be set to a concentration and a thickness such that, by the voltage applied between the gate electrode 19 and the substrate 11 in the carrier sweep period, the depletion layer can spread mainly to the n-type well layer 12 from a boundary surface between the p-type buried layer 33 and the n-type well layer 12 but such depletion layer scarcely spreads to the p-type buried layer therefrom.

The sequence of steps shown in the above embodiment of the solid state imaging device is merely a representative example. The sequence of steps shown in the above embodiment may be changed appropriately if a device structure equivalent to the desired device structure obtained by the above manufacturing method can be derived.

As described above, according to the present invention, the photo diode and the light signal detecting MOS transistor are formed adjacently, and the thickness of the first semiconductor layer under the first well region (second semiconductor layer) of the photo diode portion is larger than that of the third semiconductor layer under the second well region (fourth semiconductor layer) of the light signal detecting MOS transistor portion.

In the photo diode portion, since the first semiconductor layer under the first well region is increased in thickness, the light receiving region can be extended effectively with respect to the long wavelength light such as the red-color in the store period of the carriers. Accordingly, the improvement of the red-color sensitivity can be achieved.

In contrast, in the light signal detecting MOS transistor portion, since the third semiconductor layer under the second well region is reduced in thickness and the high concentration second buried layer is formed adjacent to the third semiconductor layer on the substrate side, the voltage supplied from the gate electrode is not so applied to the second semiconductor layer in the carrier sweep period but applied mainly to the second well region. As a result, since the strong electric field is applied to the second well region, the stored carriers can be swept effectively out from the high concentration buried layer (carrier pocket) and the second well region by the low reset voltage, and thus the improvement of the reset efficiency can be the embodiment can be achieved.

Second Embodiment

Next, a planar layout and a sectional structure of a device in a unit pixel of a MOS image sensor according to a second embodiment of the present invention.

Figure 11:
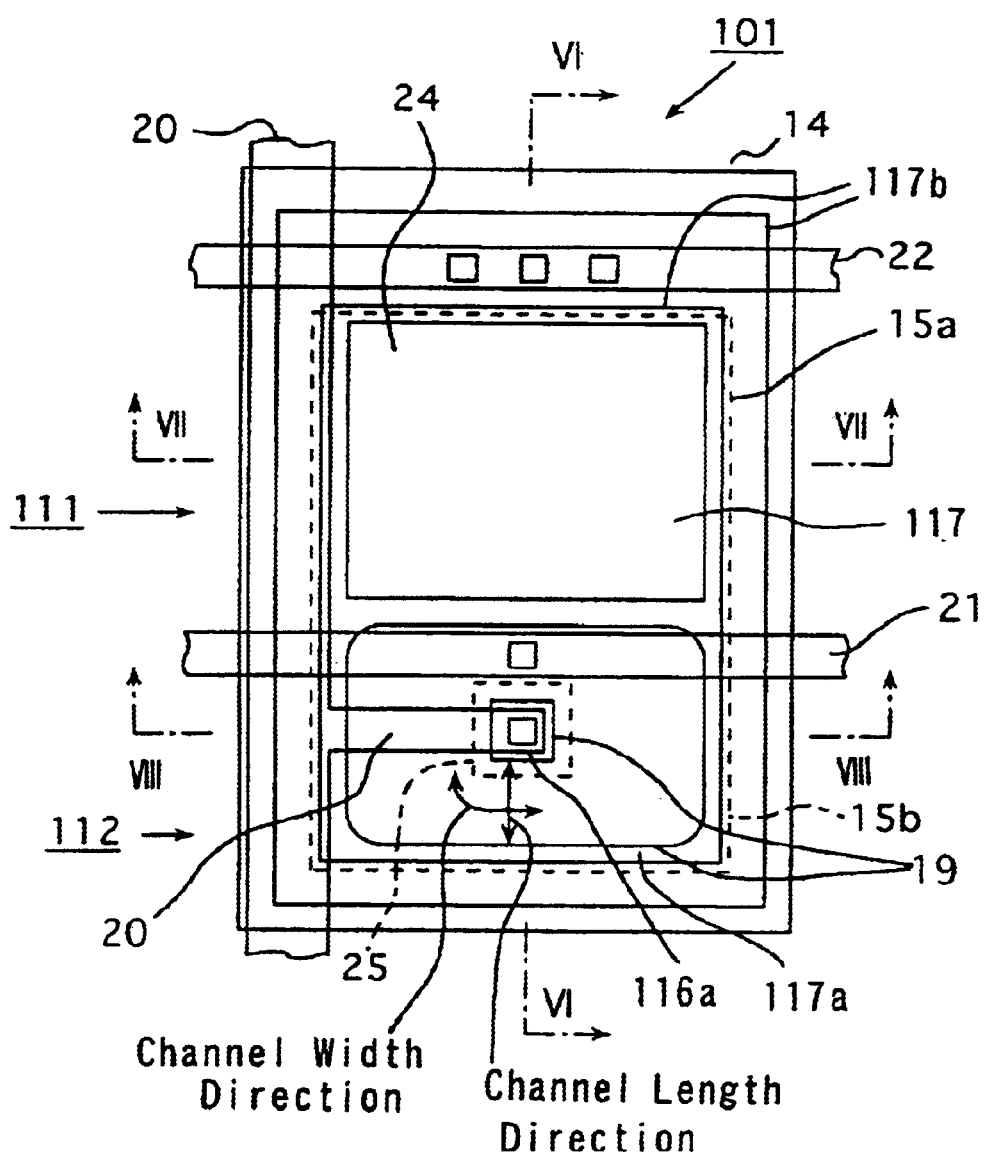
FIG. 11 is a plan view showing a device layout of a unit pixel of a solid state imaging device according to a second embodiment of the present invention.

The planar layout of the device in the unit pixel is shown in FIG. 11. In this case, features reside in an impurity region 117, drain regions 117a, 117b, and source regions 116a, 116b. However, since the planar arrangement is similar to FIG. 1 in the first embodiment, its explanation will be omitted.

Next, a device structure of the MOS image sensor according to the second embodiment of the present invention will be explained with reference to the sectional views of FIG. 12, FIG. 13, and FIG. 14 hereunder.

Figure 12:
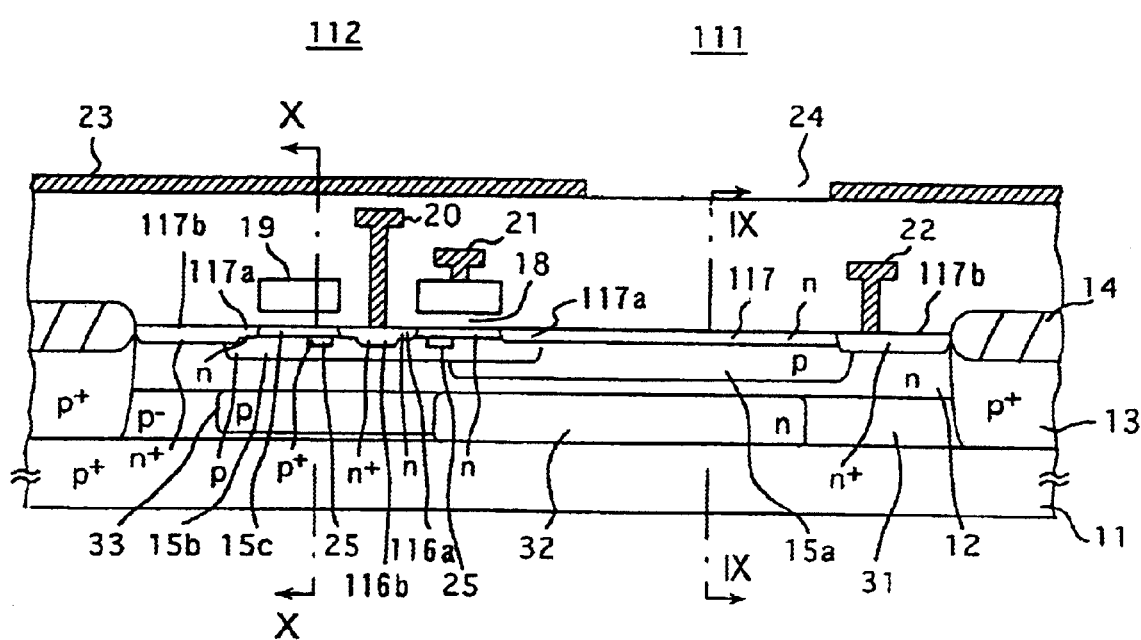
FIG. 12 is a sectional view showing a device structure of a unit pixel of the solid state imaging device according to the second embodiment of the present invention, taken along a VI—VI line in FIG. 11.

FIG. 12 is a sectional view showing the device structure of the MOS image sensor according to the second embodiment, taken along a VI—VI line in FIG. 11. Since the potential behaviors along the surface of the semiconductor substrate are similar to those in FIG. 2B, such potential behaviors will be referred to.

Figure 13:
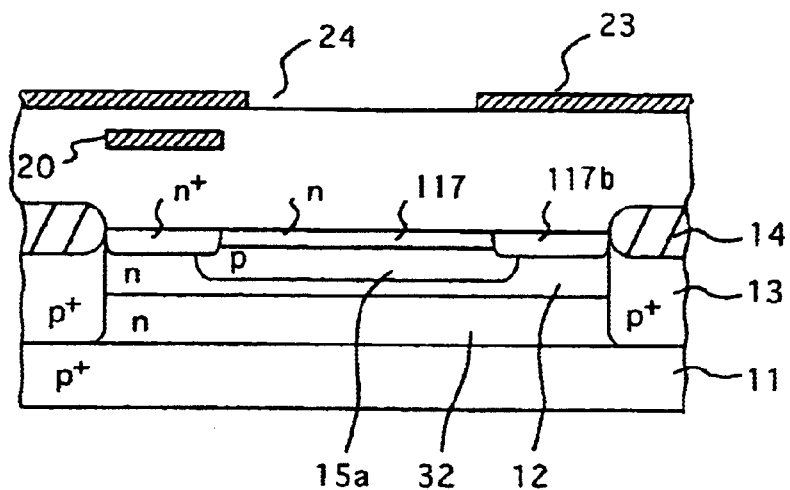
FIG. 13 is a sectional view showing a structure of a photo diode in the unit pixel of the solid state imaging device according to the second embodiment of the present invention, which is equivalent to a sectional view taken along a VII—VII line in FIG. 11.
Figure 14:
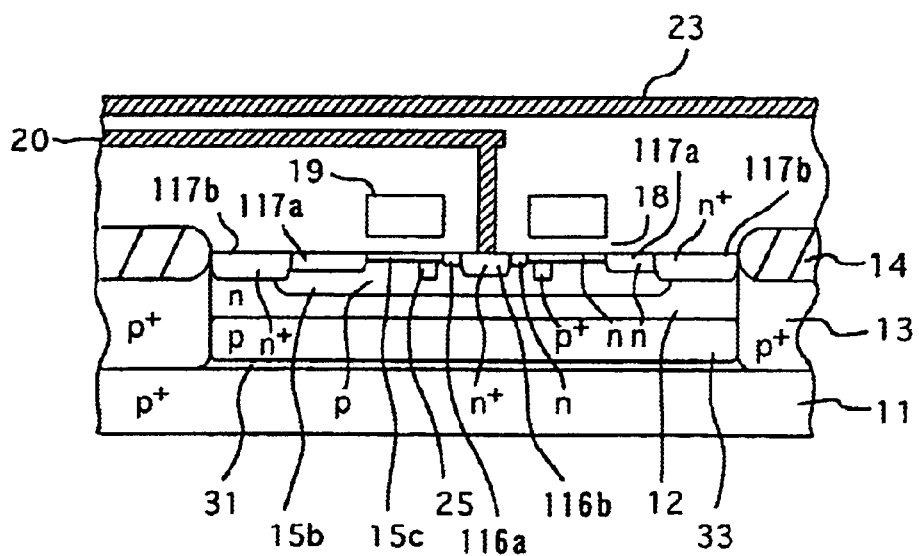
FIG. 14 is a sectional view showing a structure of a light signal detecting MOS transistor in the unit pixel of the solid state imaging device according to the second embodiment of the present invention, which is equivalent to a sectional view taken along a VIII—VIII line in FIG. 11.

FIG. 13 is a sectional view taken along a VII—VII line in FIG. 11, and FIG. 14 is a sectional view taken along a VIII—VIII line in FIG. 11.

A difference from the first embodiment resides in that the light signal detecting MOS transistor 112 has a low concentration drain structure (LDD structure).

Also, another difference resides in that the impurity region 117 of the photo diode 111 that has the substantially same impurity concentration as the low concentration drain region 117a is formed by extending the low concentration drain region 117a of the light signal detecting MOS transistor 112.

That is, the impurity region 117 and the low concentration drain region 117a are formed integrally with each other such that most of them can overlap with the surface layer of the first well region 15a and the second well region 15b that are connected mutually.

Also, the high concentration drain region, i.e., the low resistance contact layer 117b is formed in outer peripheral portions of the impurity region 117 and the low concentration drain region 117a such that it can be connected to the low concentration drain region 117a while avoiding the light receiving portion. The impurity region 117 and the low concentration drain region 117a are formed shallower in depth than the contact layer 117b.

Also, an n-type low concentration source region 116a in the peripheral portion and a high concentration source region 116b in the center portion as the contact layer connected to the source region 116a are formed to be surrounded by the ring-like gate electrode 19.

In other words, the surface layer of the second well region 15b under the gate electrode 19 acts as the channel region. Like the first embodiment, in order to keep the channel region at its inverted state or its depletion state in the normal operation voltage, the channel doped layer 15c is formed by introducing the n-type impurity into the channel region at the appropriate concentration.

In FIGS. 11 to 14, elements indicated by the same reference as those in FIG. 1, FIG. 2A, FIG. 3 and FIG. 4 denote the same elements as those in FIG. 1, FIG. 2A, FIG. 3 and FIG. 4.

Figure 15:
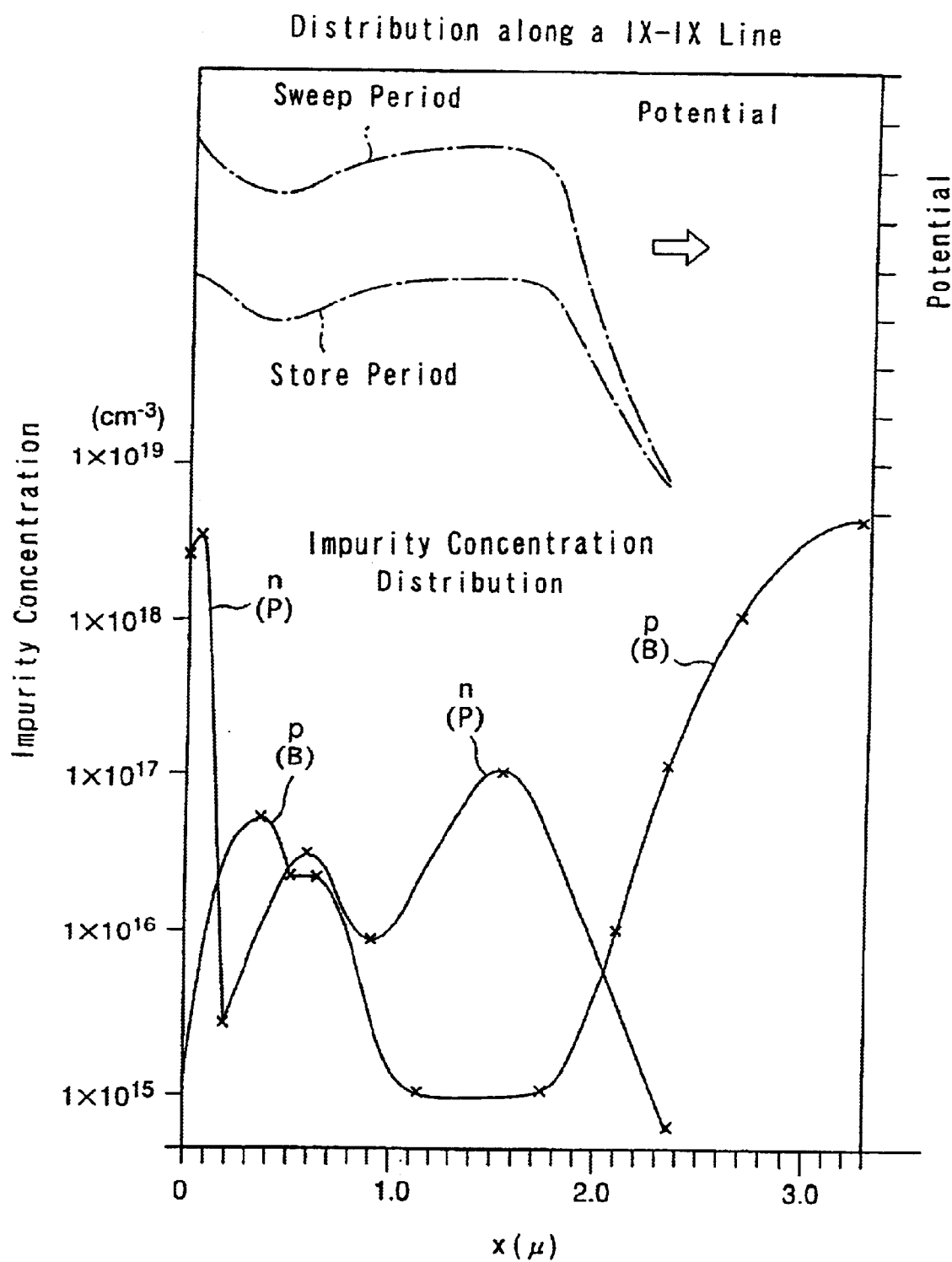
FIG. 15 is a graph showing an impurity concentration distribution and a potential distribution in the depth direction along a IX—IX line in FIG. 12, in the photo diode portion of the solid state imaging device according to the second embodiment of the present invention.

An impurity concentration distribution of the photo diode 111 portion is shown in FIG. 15. FIG. 15 is a graph showing an impurity concentration distribution and a potential distribution of a center portion of the photo diode 111 in the depth direction along a IX—IX line in FIG. 12. An abscissa denotes the depth ($\mu$m) from the surface of the semiconductor substrate in a linear scale, and an ordinate on the left side denotes the impurity concentration (cm$^{-3}$) in a logarithmic scale and an ordinate on the right side denotes the potential (arbitrary unit) in a linear scale.

As indicated by the impurity concentration distribution of FIG. 15, a thickness of the impurity region 117 is about 200 nm from the surface, a peak position of the impurity concentration of the impurity region 117 is at a depth of less than 50 nm, and the impurity concentration at the peak position is almost $3 \times 10^{18}$ cm$^{-3}$.

A thickness of the n-type buried layer 32 is about 1 $\mu$m and a thickness of the n-type layer 12 under the first well region 15a is about 0.5 $\mu$m. Thus, a total thickness over the n-type layers 12 and 32 under the first well region 15a of the photo diode 111 is about 1.5 $\mu$m. A peak position of the impurity concentration of the above impurity region 117 and an impurity concentration at the peak position may be changed appropriately.

In the photo diode 111 having the above structure, since the impurity region 117 is formed shallower in depth by setting the impurity concentration of the impurity region 117 to the low concentration, even a blue-color light that has the short wavelength and attenuates abruptly in the neighborhood of the surface can be received at the sufficient intensity.

Since the low concentration drain (LDD) structure is employed as the structure of the light signal detecting MOS transistor 112, the short channel of the light signal detecting MOS transistor 112 can be achieved and thus the higher integration degree of the solid state imaging device can be achieved.

In FIG. 12, the impurity concentration distribution along an X—X line passing through the carrier pocket 25 of the light signal detecting MOS transistor 112 portion is substantially similar to FIG. 6, and its explanation will be omitted.

In addition, since a solid state imaging system containing the above solid state imaging device has the structure similar to the first embodiment and can be driven similarly in the first embodiment, its explanation will be omitted.

Next, a method of manufacturing the solid state imaging device having the above structure will be explained with reference to FIG. 16A to FIG. 16E hereunder.

Figure 16A:
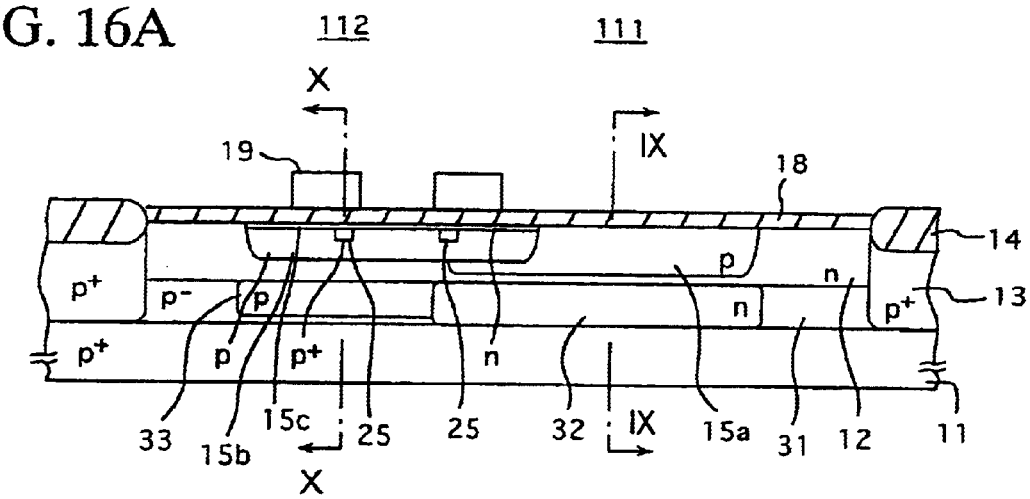
FIG. 16A to FIG. 16E are sectional views showing a method of manufacturing the solid state imaging device according to the second embodiment of the present invention.

FIG. 16A is a sectional view showing a state that the gate electrode 19 is formed. In FIG. 16A, a reference 11 denotes the p-type silicon substrate with an impurity concentration of about $4 \times 10^{18}$ cm$^{-3}$. An epitaxial layer of about 3 $\mu$m thickness is formed by epitaxial-growing p-type silicon with an impurity concentration of about $1 \times 10^{15}$ cm$^{-3}$ on the p-type silicon substrate 11. The substrate 11 constitutes an entire part of the first base layer and a part of the second base layer, and the epitaxial layer 31 constitutes a part of the second base layer. The photo diode 111 is formed on the right side of the element forming region, and the light signal detecting MOS transistor 112 is formed on the left side in the neighborhood of the photo diode 111.

The n-type well layer (one conductivity type) 12 with a peak position of about 0.55 $\mu$m and a peak impurity concentration of about $3 \times 10^{16}$ cm$^{-3}$ is formed on the surface layer of the epitaxial layer 31. The n-type well layer 12 constitutes a part of the first semiconductor layer and all the third semiconductor layer.

The n-type buried layer (first buried layer) 32 whose peak position is about 1.5 μm and whose peak impurity concentration is about $1 \times 10^{17}$ cm$^{-3}$ is formed in the photo diode 111 portion to come into contact with the substrate 11 and the n-type well layer 12. The p-type first well layer (second semiconductor layer) 15a with a peak position of about 0.3 μm and a peak impurity concentration of about $6 \times 10^{16}$ cm$^{-3}$ and with another peak position of about 0.55 μm and another peak impurity concentration of about $2 \times 10^{16}$ cm$^{-3}$ is formed in the overlying n-type well layer 12 to have the substantially same width as the n-type buried layer 32. Both the n-type buried layer (first buried layer) 32 and the first well layer 15a are formed by the ion implantation via the first mask. In this case, the n-type buried layer 32 constitutes a part of the first semiconductor layer.

Also, as shown in FIG. 6, the p-type buried layer (second buried layer) 33 with a peak position of about 1.2 μm and a peak impurity concentration of about $5 \times 10^{16}$ cm$^{-3}$ is formed in the light signal detecting MOS transistor 112 portion to comes into contact with the n-type well layer 12. The second well region 15b with a peak position of about 0.1 μm and a peak impurity concentration of about $1.2 \times 10^{17}$ cm$^{-3}$ is formed in the overlying n-type well layer 12. Both the p-type buried layer (second buried layer) 33 and the second well region 15b are formed by the ion implantation via the second mask. In this case, the p-type buried layer 33 constitutes a part of the second semiconductor layer.

The n-type channel doped layer 15c with a surface concentration of about $2 \times 10^{17}$ cm$^{-3}$ is formed on the surface layer of the second well region 15b to touch with the high concentration buried layer 25.

Also, as shown in FIG. 6, the p$^+$-type high concentration buried layer 25 with a peak position of about 0.2 μm and a peak impurity concentration of about $1 \times 10^{17}$ cm$^{-3}$ is formed in the second well region 15b under the channel doped layer 15c. The high concentration buried layer 25 is formed by the ion implantation via the third mask.

Figure 16B:
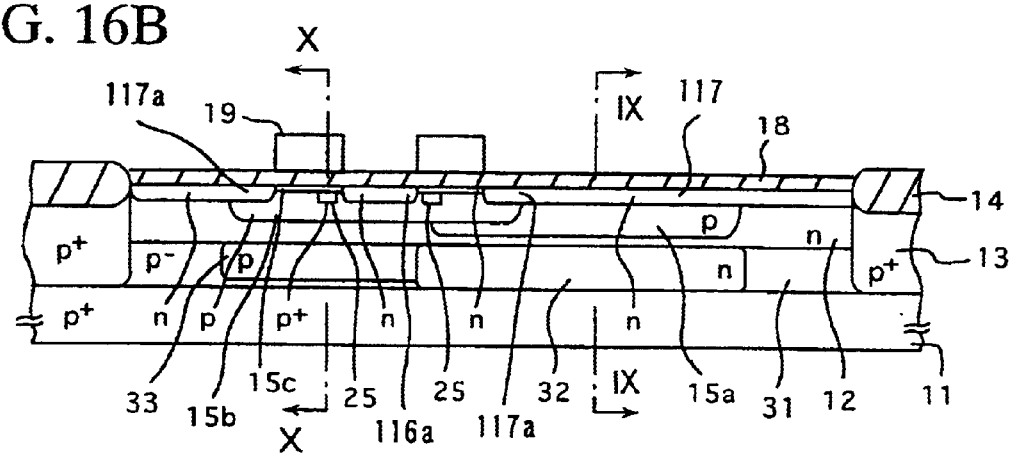

Under this condition, as shown in FIG. 16B, first the n-type impurity is ion-implanted via the gate insulating film 18 by using the gate electrode 19 as a mask in order to form the low concentration drain structure. Therefore, low concentration source/drain regions 116a and 117a are formed on both sides of the gate electrode 19.

Figure 16C:
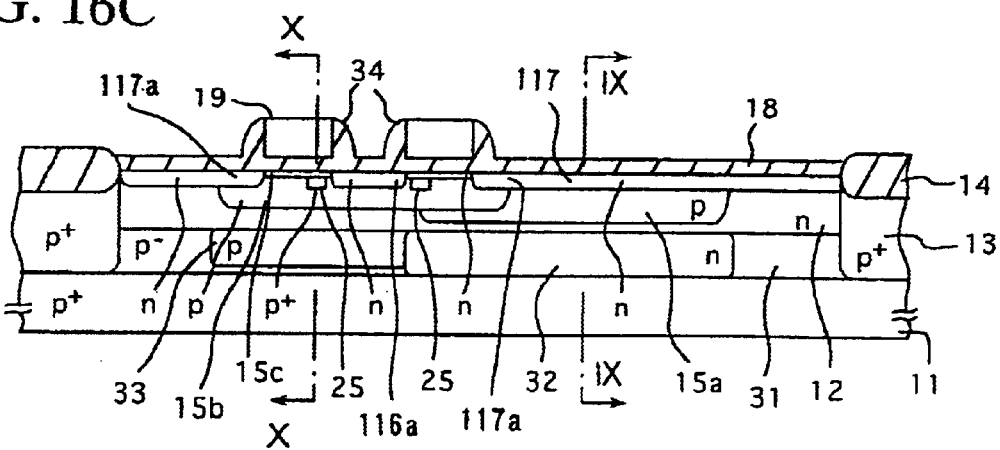

Then, as shown in FIG. 16C, the insulating film is formed by the CVD (Chemical Vapor Deposition) method, etc. Then, the sidewalls made of the insulating film are formed on side surfaces of the gate electrode 19 by the anisotropic etching.

Figure 16D:
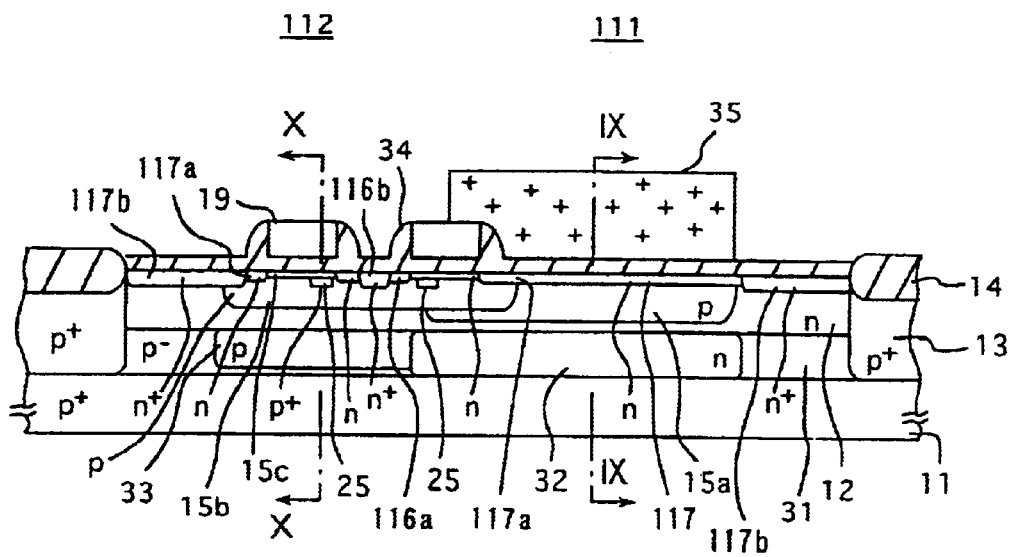

Then, as shown in FIG. 16D, the resist mask 35 for covering the light receiving portion of the photo diode 111 is formed. After this, the n-type impurity is ion-implanted by using the gate electrode 19, the sidewalls 34, and the resist mask 35 as a mask. Therefore, the high concentration source region 116b and the drain region 117b as the contact layers are formed in the center portion of the source region 116a and the peripheral portion of the drain region 117a. At this time, the n-type high concentration source/drain regions are formed simultaneously on both sides of the gate electrode of the n-CMOS in the peripheral circuit shown in FIG. 16F and on the outside of the n-type low concentration source/drain regions thereof.

Figure 16E:
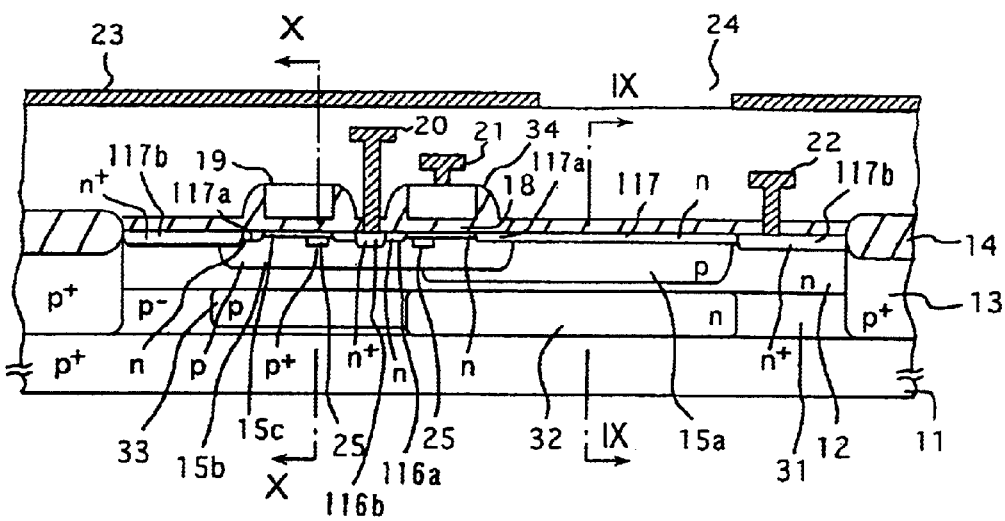

Then, as shown in FIG. 16E, after the resist mask 35 is removed, an interlayer insulating film of a first layer (not shown) is formed. In turn, the underlying source/drain electrodes or wiring layers connected to the source/drain regions 116b and 117 in the MOS forming region, and the gate wiring layer 21 connected to the gate electrode 19 are formed on the interlayer insulating film of the first layer.

In turn, after an interlayer insulating film of a second layer (not shown) is formed, overlying source/drain electrodes or wiring layers 20 connected to the underlying source/drain electrodes or the wiring layers 22 in the MOS forming region are formed on the interlayer insulating film of the second layer.

Then, after an interlayer insulating film of a third layer (not shown) is formed, the light shielding film 23 that has the opening portion (light receiving window) 24 in the photo diode 111 portion is formed on the interlayer insulating film of the third layer. After this, the cover insulating film (not shown) is formed to cover the overall surface of the device, whereby the solid state imaging device is completed.

As described above, according to the second embodiment of the present invention, since the unit pixel 101 consists of the photo diode 111 and the MOS transistor 112, the pixel portion can be fabricated by using the CMOS technology. Therefore, all the above pixel portion and the peripheral circuits such as the drive scanning circuits 102 to 104, the constant current source 106, etc. are fabricated on the same semiconductor substrate.

As a result, simplification of the manufacturing steps can be achieved and also size reduction of the solid state imaging device can be achieved by the integration of the circuit parts. The video camera, the digital still camera, the image input camera, the scanner, the facsimile, or the like may be listed.

Figure 17:
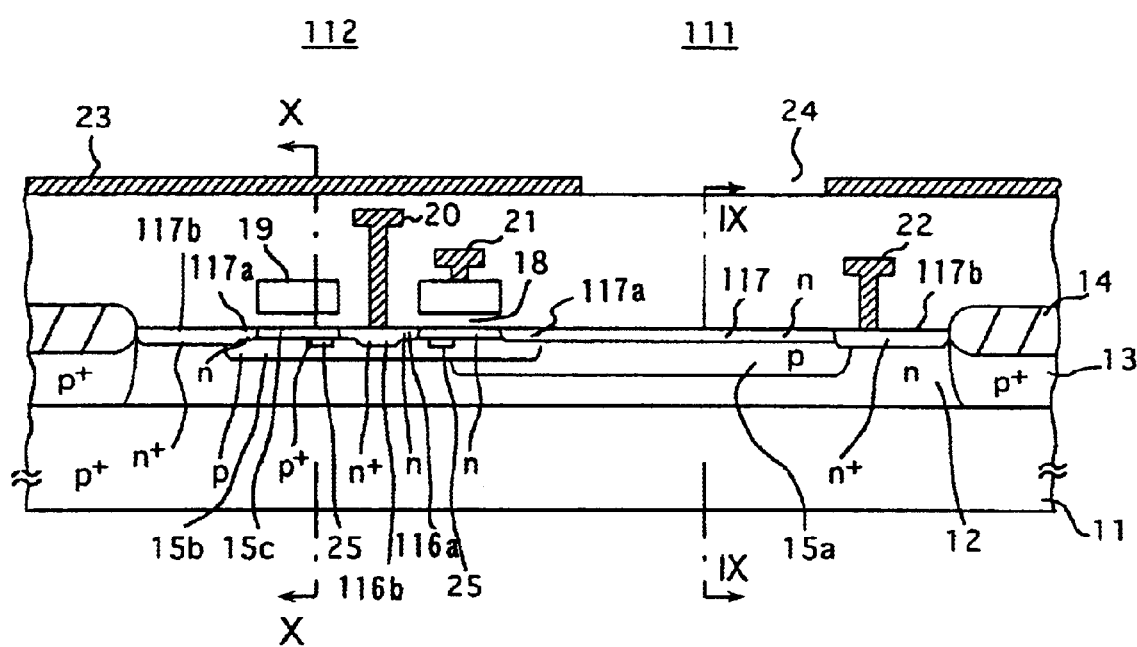
FIG. 17 is a sectional view showing a device structure of the unit pixel of the solid state imaging device according to the second embodiment of the present invention.

Next, another solid state imaging device according to the second embodiment of the present invention will be explained hereunder. FIG. 17 is a sectional view showing another solid state imaging device according to the second embodiment of the present invention. In FIG. 17, elements indicated by the same reference symbols as those in FIG. 12 denote the same elements as those in FIG. 12, and its explanation will be omitted.

In the structure of another solid state imaging device according to the second embodiment, differences from FIG. 12 are that, as shown in FIG. 17, the p-type epitaxial layer 31 is not formed on the p-type substrate 11, but the n-type epitaxial layer 12 which is equivalent to one conductivity type region 12 in FIG. 12 is formed. In addition, the first well region 15a and the second well region 15b are formed in the n-type epitaxial layer 12. Further, in FIG. 17, the n-type buried layer 32 and the p-type buried layer 33, which are formed in the p-type epitaxial layer 31 in FIG. 12, are not provided.

In this solid state imaging device, the impurity region 117 of the photo diode 111 and the low concentration drain region 117a of the light signal detecting MOS transistor 112 are formed integrally, so that the impurity region 117 has the impurity concentration substantially identical to that of the low concentration drain region 117a. As a result, since the impurity region 117 can be formed at the shallow position from the surface, the blue-color sensitivity can be improved, like the advantages in the case in FIG. 12.

As described above, the present invention is explained in detail with reference to the second embodiment. However, the scope of the present invention is not limited to the examples that are described concretely in the above second embodiment, and thus modifications of the above embodiments may be included in the scope of the present invention without departing the gist of the present invention.

For example, as shown in FIG. 15 and FIG. 6, the thickness of the epitaxial layer 31 is set to about 3 μm in the above explanation, but such thickness is not limited to this and may be varied appropriately to get the necessary characteristics.

Also, the peak position of the impurity concentration of the impurity regions 17, 117 and the impurity concentration at the peak position may also be varied appropriately to optimize the blue sensitivity according to the change in design of the thickness and the impurity concentration of the epitaxial layer 31 and the other regions and layers.

In addition, the first well region 15a and the second well region 15b having a different depth are formed separately. But they may be formed together at once to have the same depth.

Further, the p-type substrate 11 is employed, but the n-type substrate may be used in place of this. In this case, the carriers accumulated in the carrier pocket 25 are electrons out of the electron and the hole. Therefore, in order to achieve the similar advantages to the above embodiments, all conductivities of respective layers and respective regions explained in the above embodiments, etc. should be inverted.

Moreover, the order of steps of the solid state imaging device manufacturing method described in the above embodiments is a mere representative example. The order of steps of the manufacturing method described in the above embodiments may also be varied appropriately within the range in which the device structure equivalent to the desired device structure obtained by the above manufacturing method can be formed.

As described above, according to the present invention, the insulated gate field effect transistor (MOS transistor) for light signal detection has the low concentration drain region, and such low concentration drain region is extended to form the impurity region of the light receiving diode portion. In other words, the impurity region of the light receiving diode portion is formed integrally with the low concentration drain region, and thus the impurity concentration of the impurity region is reduced.

Therefore, since the depth of the impurity region can be formed much more shallowly, even the blue light. that has a short wavelength and is attenuated abruptly near the surface can be received at sufficient strength.

In addition, since the light receiving diode 111 has the buried structure for the light emitting charge, the noise and the dark current generated by the charges except the light emitting charge can be maintained low.

As a result, the improvement of the blue sensitivity can be achieved while keeping the noise and the dark current low.

Furthermore, the CMOS circuit for driving the solid state imaging device is formed on the same substrate as the solid state imaging device, and the low concentration impurity region 17, 117 is formed simultaneously when the low concentration drain region of the MOS transistor that constitutes the CMOS circuit and has the LDD structure is formed, and also the high concentration contact layer is formed simultaneously when the high concentration drain region of the same MOS transistor having the LDD structure is formed.

Accordingly, improvement of the blue sensitivity can be attained while maintaining the noise and the dark current without newly increasing the manufacturing steps.

What is claimed is:

1. A method of manufacturing a solid state imaging device, comprising the steps of:
    forming a first buried layer of one conductivity type in an interior of a seventh semiconductor layer of opposite conductivity type by introducing one conductivity type impurity into the seventh semiconductor layer by using a first mask;
    forming a first well region of opposite conductivity type on a surface of the seventh semiconductor layer and over the first buried layer by introducing opposite conductivity type impurity into the seventh semiconductor layer by using the first mask;
    forming a one conductivity type region connected to the first buried layer and containing the first well region by introducing one conductivity type impurity into the surface of the seventh semiconductor layer;
    forming a second buried layer of opposite conductivity type, that has higher impurity concentration than the seventh semiconductor layer, under the one conductivity type region, by introducing opposite conductivity type impurity in an interior of the seventh semiconductor layer by using a second mask;
    forming a second well region of opposite conductivity type that is connected to the first well region, by introducing opposite conductivity type impurity on a surface of the one conductivity type region and over the second buried layer by using the second mask;
    forming a channel doped layer of one conductivity type by introducing one conductivity type impurity on a surface of the second well region by using the second mask;
    forming a high concentration buried layer of opposite conductivity type, that has higher impurity concentration than the second well region, in an interior of the second well region under the channel doped layer by introducing opposite conductivity type impurity in the interior of the second well region by using a third mask;
    forming a gate insulating film on the seventh semiconductor layer by thermal oxidation;
    forming a gate electrode on the gate insulating film covering the high concentration buried layer and bringing the high concentration buried layer close to a source region side; and
    forming a source region and a drain region of one conductivity type on the surface of the second well region, on both sides of the gate electrode, and forming an impurity region on a surface of the first well region.

2. A method of manufacturing a solid state imaging device, according to claim 1, wherein the gate electrode has a ring-like shape, the source region is formed on the surface of the second well region surrounded by the gate electrode, and the drain region is formed on the surface of the second well region surrounding the gate electrode.

3. A method of manufacturing a solid state imaging device, comprising the steps of:
    forming a first buried layer of one conductivity type in an interior of a seventh semiconductor layer of opposite conductivity type by introducing one conductivity type impurity into the seventh semiconductor layer by using a first mask;
    forming a first well region of opposite conductivity type on a surface of the seventh semiconductor layer and over the first buried layer by introducing opposite conductivity type impurity into the seventh semiconductor layer by using the first mask;
    forming a one conductivity type region connected to the first buried layer and containing the first well region by introducing one conductivity type impurity into the surface of the seventh semiconductor layer;
    forming a second buried layer of opposite conductivity type, that has higher impurity concentration than the seventh semiconductor layer, under the one conductivity type region, by introducing opposite conductivity type impurity in an interior of the seventh semiconductor layer by using a second mask;

forming a second well region of opposite conductivity type that is connected to the first well region, by introducing opposite conductivity type impurity on a surface of the one conductivity type region and over the second buried layer by using the second mask;

forming a channel doped layer of one conductivity type by introducing one conductivity type impurity on a surface of the second well region by using the second mask;

forming a high concentration buried layer of opposite conductivity type, that has higher impurity concentration than the second well region, in an interior of the second well region under the channel doped layer by introducing opposite conductivity type impurity in the interior of the second well region by using a third mask;

forming a gate insulating film on the seventh semiconductor layer by thermal oxidation;

forming a gate electrode on the gate insulating film covering the high concentration buried layer and bringing the high concentration buried layer close to a source region side;

forming an impurity region of one conductivity type on a surface of the first well region at a same time of forming a source region and a drain region of one conductivity type on the surface of the second well region, on both sides of the gate electrode, by introducing one conductivity type impurity on the surface of the seventh semiconductor layer;

forming sidewalls on side surfaces of the gate electrode; and forming a resist film covering a part of the impurity region acting as a light receiving portion, and then forming a contact layer that is in contact with the drain region and has higher concentration than the drain region by introducing one conductivity impurity by using the gate electrode, the sidewalls, and the resist film as a mask.

4. A solid state imaging device manufacturing method according to claim 3, wherein the first buried layer and the first well region are formed by using the first mask in a same planar position and a different depth respectively, and the second buried layer, the second well region, and the channel doped layer are formed by using the second mask in a same planar position and a different depth respectively.

5. A solid state imaging device manufacturing method according to claim 3, wherein a MOS transistor that constitutes a CMOS circuit for driving the solid state imaging device and has a low concentration drain (LDD) structure is formed on a same substrate as the solid state imaging device, and the drain region is formed at a same time when a low concentration drain region of the MOS transistor in the CMOS circuit is formed.

6. A solid state imaging device manufacturing method according to claim 3, wherein a MOS transistor that constitutes a CMOS circuit for driving the solid state imaging device and has a low concentration drain (LDD) structure is formed on a same substrate as the solid state imaging device, and the contact layer is formed at a same time when a high concentration drain region of the MOS transistor in the CMOS circuit is formed.

7. A solid state imaging device manufacturing method according to claim 3, wherein the gate electrode has a ring-like shape, the source region is formed on the surface of the second well region surrounded by the gate electrode, and the drain region is formed on the surface of the second well region to surround the gate electrode.

8. A solid state imaging device manufacturing method comprising the steps of:

forming a first well region of opposite conductivity type on a surface of a one conductivity type region by introducing an opposite conductivity type impurity into the one conductivity type region of a surface layer of a semiconductor substrate;

forming a second well region of opposite conductivity type connected to the first well region by introducing the opposite conductivity type impurity into the surface of the one conductivity type region;

forming a channel doped layer of one conductivity type by introducing a one conductivity type impurity into a surface of the second well region;

forming a high concentration buried layer of opposite conductivity type, that has an impurity concentration higher than the second well region, in an interior of the second well region under the channel doped layer by introducing the opposite conductivity type impurity into the interior of the second well region;

forming a gate insulating film by thermally oxidizing a surface of the semiconductor substrate;

forming a gate electrode on the gate insulating film covering the high concentration buried layer and bringing the high concentration buried layer close to a source region side;

forming one conductivity type source/drain regions on the surface of the second well region, on both sides of the gate electrode, and simultaneously forming a one conductivity type impurity region on the surface of the first well region, by introducing the one conductivity type impurity into the surface of the semiconductor substrate; and forming a resist film covering a part of the impurity region acting as a light receiving portion, and then forming a high concentration contact layer, in contact with the drain region and having a concentration higher than the drain region, by introducing the one conductivity type impurity while using the gate electrode and the resist film as a mask.

9. A solid state imaging device manufacturing method according to claim 8, wherein the second well layer and the channel doped layer are formed by using a same mask in a same planar position and a different depth respectively.

10. A solid state imaging device manufacturing method according to claim 8, wherein the gate electrode has a ring-like shape, the source region is formed on the surface of the second well region surrounded by the gate electrode, and the drain region is formed on the surface of the second well region surrounding the gate electrode.

* * * * *